(12) United States Patent
Fujiwara

(10) Patent No.: US 10,403,675 B2
(45) Date of Patent: Sep. 3, 2019

(54) SEMICONDUCTOR DEVICE AND METHOD FOR MANUFACTURING SEMICONDUCTOR DEVICE, SOLID-STATE IMAGE PICKUP ELEMENT, IMAGE PICKUP DEVICE, AND ELECTRONIC APPARATUS

(71) Applicant: SONY SEMICONDUCTOR SOLUTIONS CORPORATION, Kanagawa (JP)

(72) Inventor: Atsushi Fujiwara, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 15/535,534

(22) PCT Filed: Jan. 4, 2016

(86) PCT No.: PCT/JP2016/050013
§ 371 (c)(1),
(2) Date: Jun. 13, 2017

(87) PCT Pub. No.: WO2016/114152
PCT Pub. Date: Jul. 21, 2016

(65) Prior Publication Data
US 2017/0338273 A1    Nov. 23, 2017

(30) Foreign Application Priority Data
Jan. 13, 2015   (JP) .................................. 2015-004096

(51) Int. Cl.
*H01L 21/78*    (2006.01)
*H01L 27/14*    (2006.01)
(Continued)

(52) U.S. Cl.
CPC ........ *H01L 27/14687* (2013.01); *H01L 21/78* (2013.01); *H01L 27/14* (2013.01);
(Continued)

(58) Field of Classification Search
None
See application file for complete search history.

(56) References Cited

U.S. PATENT DOCUMENTS

| 5,864,170 A | 1/1999 | Nakai |
| 2007/0166955 A1 | 7/2007 | Noma |

(Continued)

FOREIGN PATENT DOCUMENTS

| CN | 1988133 A | 6/2007 |
| CN | 101752396 A | 6/2010 |

(Continued)

OTHER PUBLICATIONS

International Search Report and Written Opinion of PCT Application No. PCT/JP2016/050013, dated Feb. 9, 2016, 3 pages of English Translation and 14 pages of ISRWO.

*Primary Examiner* — Whitney Moore
(74) *Attorney, Agent, or Firm* — Chip Law Group

(57) ABSTRACT

The present technology relates to a semiconductor device that suppresses scattering dusts caused by dicing, chipping due to clogging, and further suppresses peel-off of an undercoat from a passivation film, thereby improving yields in manufacturing to realize cost reduction and a method for manufacturing the semiconductor device, a solid-state image pickup element, an image pickup device, and an electronic apparatus. In a step of exposing a pad by etching, when etching a lens material layer as an uppermost layer and a passivation layer, a pad portion and a blade region to be cut by a blade at the time of dicing are simultaneously etched, while a part of a region including both portions and a part (Continued)

therebetween or all the region on the lump, is simultaneously etched. Thereafter, in a layer of the semiconductor substrate under the lens material layer, only the pad portion is etched to expose the pad.

8 Claims, 23 Drawing Sheets

(51) Int. Cl.
    *H04N 5/369* (2011.01)
    *H01L 27/146* (2006.01)

(52) U.S. Cl.
    CPC .. *H01L 27/14627* (2013.01); *H01L 27/14632* (2013.01); *H01L 27/14636* (2013.01); *H04N 5/369* (2013.01); *H01L 27/1464* (2013.01)

(56) References Cited

U.S. PATENT DOCUMENTS

| | | | |
|---|---|---|---|
| 2010/0155582 | A1 | 6/2010 | Hirano et al. |
| 2012/0205769 | A1 | 8/2012 | Tsai et al. |
| 2012/0217374 | A1 | 8/2012 | Nishizawa |
| 2013/0020468 | A1 | 1/2013 | Mitsuhashi et al. |
| 2013/0153901 | A1 | 6/2013 | Jangjian et al. |
| 2014/0151838 | A1 | 6/2014 | Iizuka |
| 2015/0035109 | A1 | 2/2015 | Kataoka |

FOREIGN PATENT DOCUMENTS

| | | |
|---|---|---|
| CN | 102651377 A | 8/2012 |
| CN | 103022062 A | 4/2013 |
| CN | 103855175 A | 6/2014 |
| CN | 104272720 A | 1/2015 |
| EP | 1801849 A2 | 6/2007 |
| JP | 10-189583 A | 7/1998 |
| JP | 2000-183322 A | 6/2000 |
| JP | 2001-135792 A | 5/2001 |
| JP | 2006-202865 A | 8/2006 |
| JP | 2007-173483 A | 7/2007 |
| JP | 2010-141020 A | 6/2010 |
| JP | 2011-146633 A | 7/2011 |
| JP | 2011-238877 A | 11/2011 |
| JP | 2012-178496 A | 9/2012 |
| JP | 2013-26329 A | 2/2013 |
| JP | 2013-125970 A | 6/2013 |
| JP | 2013-131613 A | 7/2013 |
| JP | 2013-219319 A | 10/2013 |
| JP | 2014-110279 A | 6/2014 |
| JP | 2015-005577 A | 1/2015 |
| JP | 2015-159338 A | 9/2015 |
| KR | 10-0249889 A | 5/2000 |
| KR | 10-2007-0067634 A | 6/2007 |
| KR | 10-2014-0146060 A | 12/2014 |
| TW | 201027738 A | 7/2010 |
| TW | I329931 B | 9/2010 |
| TW | 201324755 A | 6/2013 |
| TW | 201347153 A | 11/2013 |
| WO | 2013/137049 A1 | 9/2013 |

SEMICONDUCTOR DEVICE AND METHOD FOR MANUFACTURING SEMICONDUCTOR DEVICE, SOLID-STATE IMAGE PICKUP ELEMENT, IMAGE PICKUP DEVICE, AND ELECTRONIC APPARATUS

CROSS REFERENCE TO RELATED APPLICATIONS

This application is a U.S. National Phase of International Patent Application No. PCT/JP2016/050013 filed on Jan. 4, 2016, which claims priority benefit of Japanese Patent Application No. JP 2015-004096 filed in the Japan Patent Office on Jan. 13, 2015. Each of the above-referenced applications is hereby incorporated herein by reference in its entirety.

TECHNICAL FIELD

The present technology relates to a semiconductor device and a method for manufacturing the semiconductor device, a solid-state image pickup element, an image pickup device, and an electronic apparatus, and in particular, to a semiconductor device configured to suppress scattering dusts caused by dicing, chipping due to clogging, and further suppress peel-off of an undercoat from a passivation film, thereby improving yields in manufacturing of a semiconductor device and a method for manufacturing the semiconductor device, a solid-state image pickup element, an image pickup device, and an electronic apparatus.

BACKGROUND ART

A plurality of semiconductor devices is formed on a semiconductor substrate through numbers of semiconductor manufacturing processes. Thereafter, dicing is conducted with a dicing blade along a scribe line region for division of individual semiconductor device regions.

At the time of dicing along a scribe line region, when films of SiO2, SiN, SiON, and the like remain deposited in the scribe line region, cutting these films causes a dicing blade to gradually clog. Then, chipping occurs at an end portion of a semiconductor device. Therefore, for preventing such a situation from occurring, there is provided a technology of removing an interlayer insulating film or a passivation film by etching (see Patent Document 1).

Additionally, in a solid-state image pickup element and the like, on a passivation film, a planarizing coat film, and an organic film such as a color filter, an on-chip lens material or the like are further laminated. Dicing these films might cause scattering dusts or peel-off of an undercoat from a passivation film. These dusts attach to a light receiving portion of a solid-state image pickup element to have a defective pixel, thereby inviting deterioration in yields, in addition to a defective appearance. A countermeasure is to similarly conduct etching removal in a wafer process before dicing so as to minimize dicing of an organic film.

As conventional art, there is proposed a structure in which simultaneously with resist patterning for pad portion opening, resist patterning is conducted also along a scribe line region to simultaneously etch both the patterns, thereby reducing the number of works for a wafer process while reducing occurrence of a defective appearance after dicing (see Patent Document 2).

CITATION LIST

Patent Document

Patent Document 1: Japanese Patent Application Laid-Open No. H5-3249
Patent Document 2: Japanese Patent Application Laid-Open No. 2007-184355

SUMMARY OF THE INVENTION

Problems to be Solved by the Invention

However, when a product pad is present at a position deeper than a top face of a semiconductor substrate, as typified by a back-side-illuminated solid-state image pickup element, processing of a pad portion should be divisionally executed a plurality of times. Each pad processing size is set to be a pad size that enables a sufficient wire bonding strength to be ensured when final opening etching is finished, which size is gradually increased to be laid out toward a first pad opening size by counting backward from overlay in lithography and variation in an amount of exposure.

Then, when simultaneously patterning the pad and a scribe processing region as described above, both photoresist opening portions are so close that a narrow pattern remains therebetween.

In this part, there occurs resist collapse during etching, a pattern error during blade-dicing, or the like. Additionally, placing a pad and a scribe line apart from each other for avoiding occurrence of resist collapse during etching, a pattern error during blade-dicing, or the like, leads to an increase in a chip size of a semiconductor device, resulting in a decrease in the number of semiconductor devices fabricated from one semiconductor substrate (wafer).

The present technology has been conceived in view of these circumstances and aims to realize, in particular, in a semiconductor device and a method for manufacturing the same, an increase in yields in manufacturing to reduce costs by suppressing scattering dusts caused by dicing, chipping due to clogging, and further suppressing peel-off of an undercoat from a passivation film.

Solutions to Problems

A semiconductor device of one aspect of the present technology has a plurality of semiconductor chips formed in a semiconductor substrate, wherein at the time of opening a connecting pad, when etching for opening the pad is divisionally conducted a plurality of times on a layer basis, a part of a plurality of layers to be a unit to be etched is subjected to etching for opening a scribe line portion simultaneously with the etching for forming an opening of the pad, thereby removing a part or entire region linking both the portions by etching.

A layer as a part of the layers to be the unit to be etched may include a layer to be etched first in the etching to be divisionally conducted a plurality of times.

A layer as a part of the layers to be the unit to be etched may be a plurality of layers including the layer to be etched first in the etching to be divisionally conducted a plurality of times.

A layer as a part of the layers to be the unit to be etched may include a layer with a part thereof or all parts thereof collectively etched with a pattern covering from a blade region of a scribe line portion in which a periphery of the semiconductor device is blade-diced to a region including the pad.

The semiconductor device may be a three-dimensional mounting substrate having a lamination of a plurality of semiconductor wafers bonded together, the semiconductor wafers being each provided with a through electrode.

A method for manufacturing a semiconductor device of one aspect of the present technology is a method for manufacturing a semiconductor device with a plurality of semiconductor chips formed in a semiconductor substrate, including: a first step of, at the time of opening a connecting pad, when etching for opening the pad is divisionally conducted a plurality of times on a layer basis, subjecting a part of a plurality of layers to be a unit to be etched to etching for forming an opening of a scribe line portion simultaneously with the etching for forming an opening of the pad, as well as conducting etching of a part or entire region linking the opening of the pad and the opening of the scribe line portion; and a second step of conducting etching for forming an opening of only the pad after the first step.

A third step of conducting, in separate regions, etching for forming an opening of the scribe line portion simultaneously with etching for forming an opening of the pad after the first step and before the second step may further be included.

A solid-state image pickup element of one aspect of the present technology includes: a light collecting optical portion which collects an incident light; an optical/electrical conversion portion which converts a light collected by the light collecting optical portion into an electrical signal according to an amount of the light; a plurality of pixel portions formed with a plurality of the optical/electrical conversion portions; a wiring layer on one surface side of a semiconductor substrate on which the pixel portions are formed; and a signal processing portion which processes a signal subjected to optical/electrical conversion, wherein with a plurality of semiconductor chips formed in a semiconductor substrate configuring the solid-state image pickup element, at the time of opening a connecting pad, when etching for opening the pad is divisionally conducted a plurality of times on a layer basis, a part of a plurality of layers to be a unit to be etched is subjected to etching for opening a scribe line portion to be blade-diced surrounding the solid-state image pickup device simultaneously with the etching for forming an opening of the pad, thereby removing a part or entire region linking both the portions by etching.

The optical/electrical conversion portion may receive a light incident from a surface on which the wiring layer is formed.

The optical/electrical conversion portion may receive a light incident from a side opposite to the surface on which the wiring layer is formed.

An image pickup device of one aspect of the present technology includes a solid-state image pickup element having: a light collecting optical portion which collects an incident light; an optical/electrical conversion portion which converts a light collected by the light collecting optical portion into an electrical signal according to an amount of the light; a plurality of pixel portions formed with a plurality of the optical/electrical conversion portions; a wiring layer on one surface side of a semiconductor substrate on which the pixel portions are formed; and a signal processing portion which processes a signal subjected to optical/electrical conversion, wherein with a plurality of semiconductor chips formed in a semiconductor substrate configuring the solid-state image pickup element, at the time of opening a connecting pad, when etching for opening the pad is divisionally conducted a plurality of times on a layer basis, a part of a plurality of layers to be a unit to be etched is subjected to etching for opening a scribe line portion to be blade-diced surrounding the solid-state image pickup device simultaneously with the etching for forming an opening of the pad, thereby removing a part or entire region linking both the portions by etching.

An electronic apparatus of one aspect of the present technology includes a solid-state image pickup element having: a light collecting optical portion which collects an incident light; an optical/electrical conversion portion which converts a light collected by the light collecting optical portion into an electrical signal according to an amount of the light; a plurality of pixel portions formed with a plurality of the optical/electrical conversion portions; a wiring layer on one surface side of a semiconductor substrate on which the pixel portions are formed; and a signal processing portion which processes a signal subjected to optical/electrical conversion, wherein with a plurality of semiconductor chips formed in a semiconductor substrate configuring the solid-state image pickup element, at the time of opening a connecting pad, when etching for opening the pad is divisionally conducted a plurality of times on a layer basis, a part of a plurality of layers to be a unit to be etched is subjected to etching for opening a scribe line portion to be blade-diced surrounding the solid-state image pickup device simultaneously with the etching for forming an opening of the pad, thereby removing a part or entire region linking both the portions by etching.

According to one aspect of the present technology, with a plurality of semiconductor chips formed in a semiconductor substrate configuring a solid-state image pickup element, at the time of opening a connecting pad, when etching for opening the pad is divisionally conducted a plurality of times on a layer basis, a part of a plurality of the layers to be a unit to be etched is subjected to etching for opening a scribe line portion to be blade-diced surrounding the solid-state image pickup device simultaneously with the etching for forming an opening of the pad, so that apart or entire region linking both the portions is removed by etching.

Effects of the Invention

According to one aspect of the present technology, it is possible to increase yields in manufacturing to reduce costs by suppressing scattering dusts caused by dicing, chipping due to clogging, and further suppressing peel-off of an undercoat from a passivation film.

MODE FOR CARRYING OUT THE INVENTION

In the following, best modes for carrying out the present invention will be described, which will not limit the present invention.

First Embodiment

<Configuration Example of Solid-State Image Pickup Element>

Figure 1:
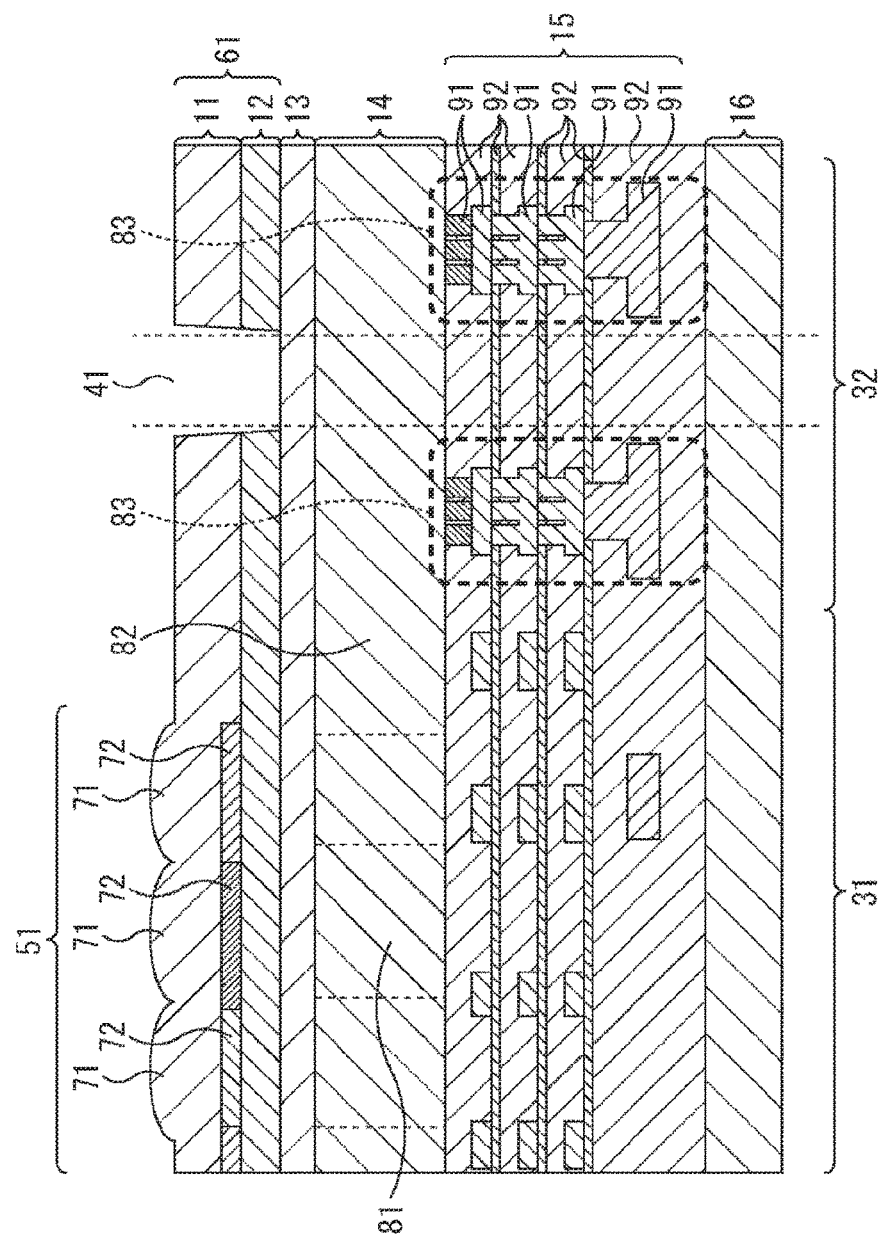
FIG. 1 is a view for explaining a side section of a solid-state image pickup element using a semiconductor device to which the present technology is applied.

FIG. 1 is a side sectional view showing a schematic configuration of one embodiment of a back-side-illuminated solid-state image pickup element as a semiconductor device to which the present technology is applied.

The back-side-illuminated solid-state image pickup element of FIG. 1 has a lens filter layer 11, a planarizing layer 12, an inorganic passivation layer 13, a semiconductor substrate 14, a wiring layer 15, and a supporting substrate 16 which are vertically laminated in this order from the top. Additionally, the lens filter layer 11 and the planarizing layer 12 are collectively referred to also as a lens material layer 61. On a back face side of the semiconductor substrate 14 (on an upper side of the semiconductor substrate 14 in the figure), the inorganic passivation layer 13 and the planarizing film 12 having light transmission properties are formed.

Additionally, formed from left in a horizontal direction in FIG. 1 are a solid-state image pickup element 31 formed with a plurality of pixel portions 51 having a group of transistors (not shown) such as a transfer transistor, an amplification transistor, a reset transistor and the like, and a scribe line 32 isolated by a dicing blade when the solid-state image pickup element 31 is individually diced.

Figure 2:
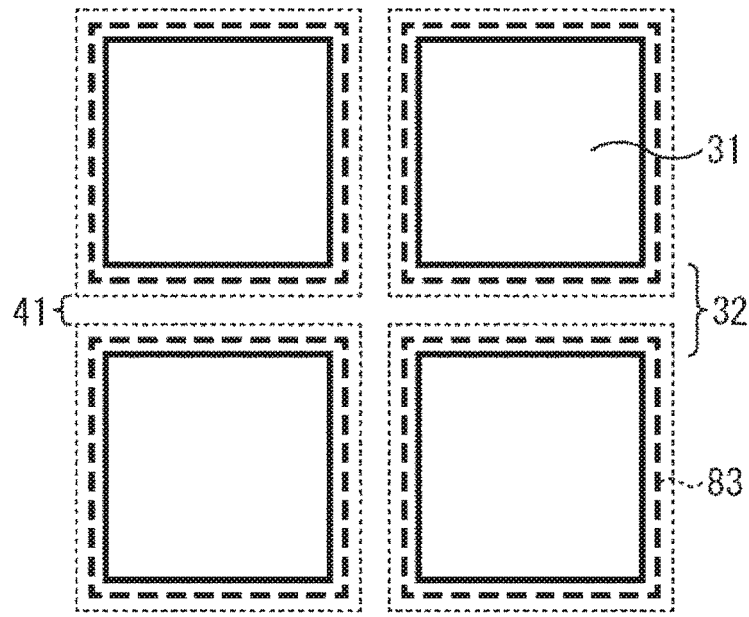
FIG. 2 is a view for explaining a top view of the solid-state image pickup element of FIG. 1.

As shown in FIG. 2, the solid-state image pickup elements 31 are disposed in lattice in the horizontal direction, and the scribe line 32 is formed between the solid-state image pickup elements 31. The solid-state image pickup elements 31 have ring-shaped guard rings 83 provided around peripheries thereof, between which a blade region 41 is provided. When the solid-state image pickup element 31 is individually diced, the blade region 41 is diced (individually isolated) as a result of cutting into the blade region 41 by the dicing blade for dicing. The scribe line 32 is set to have a width of approximately 50 to 200 μm according to a set width of the blade region 41. The guard ring 83 is formed by the same process as that of the wiring layer 15 in a chip region. In the scribe line 32, an alignment mark for lithography, an inspection pattern, and the like can be formed.

The pixel portion 51 of the lens filter layer 11 of the solid-state image pickup element 31 is provided with a condensing lens layer 71, which condensing lens layer 71 generates electric charges by optical/electrical conversion to collect an incident light on an optical/electrical conversion portion 81 which outputs a pixel signal. Additionally, under the condensing lens layer 71, a color filter layer 72 is provided which allows only a light of a specific wavelength such as RGB (red, green, and blue) to be transmitted, which color filter layer 72 enables a light of a wavelength transmitted through each filter to enter the optical/electrical conversion portion 81. The optical/electrical conversion layer 81 is formed in an active layer 82 of the semiconductor substrate 14 formed of, for example, a silicon substrate or the like. Further, a signal processing portion (not shown) is formed which processes signal electric charges read from each optical/electrical conversion portion 81.

Additionally, the wiring layer 15 is formed on a top face side of the semiconductor substrate 14 (a lower side of the semiconductor substrate 14 in the figure) in which the optical/electrical conversion portion 81 is formed. The wiring layer 15 is formed with a wire 91, and an insulating film 92 covering the wire 91. The wiring layer 15 is formed on the supporting substrate 16. The supporting substrate 16 is formed of a silicon substrate, for example. A material of the wire 91 includes, for example, aluminium, copper, and tungsten as main components.

<Processing of Conventional Pad Portion>

Figure 3:
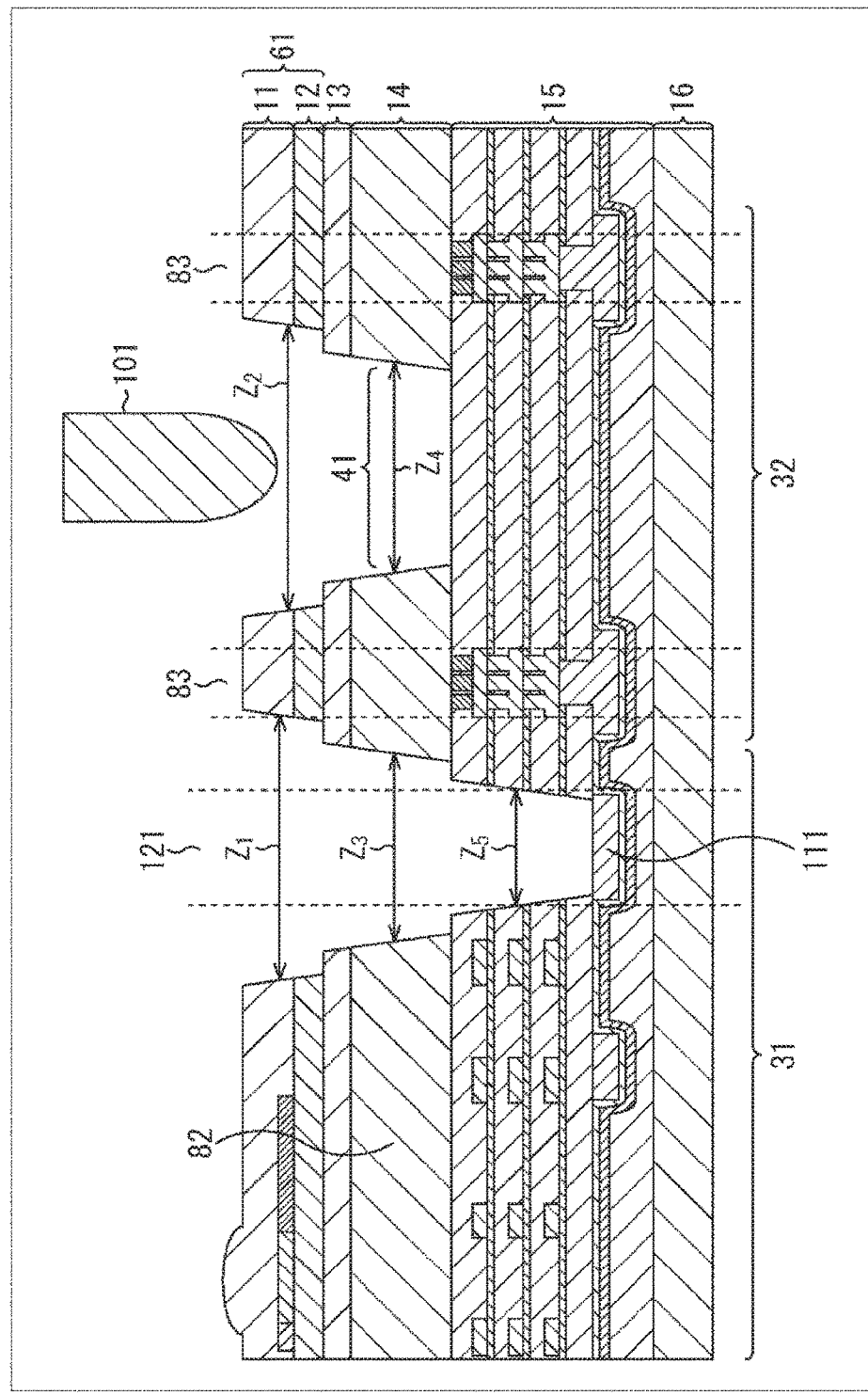
FIG. 3 is a view for explaining a solid-state image pickup element in a conventional solid-state image pickup device.

FIG. 3 is a schematic side sectional view of a pad portion of the back-side-illuminated solid-state image pickup element shown in FIG. 1, the pad portion being processed by a conventional method.

As shown in FIG. 3, formed in the lens material layer 61 from the top are opening portions Z1 and Z2 in a pad portion 121 and the blade region 41, respectively, by etching. Additionally, formed in the semiconductor substrate 14 are opening portions Z3 and Z4 in the pad portion 121 and the blade region 41, respectively, by etching. Further, formed in the wiring layer 15 is an opening portion Z5 only in the pad portion 121 by etching. In such a configuration, an opening portion is formed in a pad 111, and processing is also conducted so as to prevent scattering dusts and peel-off of an undercoat from a passivation film that are caused by cutting into the blade region 41 in the scribe line 32 by a dicing blade 101.

In addition, although FIG. 3, which is a side section, illustrates in a similar manner how opening widths of the pad portion 121 and the blade region 41 are formed, the pad portion 121 is formed to have the pad 111 exposed in spots, while an opening portion of the blade region 41 is formed so as to surround the solid-state image pickup element 31 as shown in FIG. 2.

Additionally, opening widths of the opening portions Z1 to Z5 are set to have Z1>Z3>Z5 among the opening portions, and Z2>Z4 between the opening portions. This is because a taper is generated when an opening portion is formed by etching, and therefore, from an upper part toward a lower part of the figure, the opening width is narrowed. Therefore, with respect to a width required for exposing the pad 111, the more upper the layer is in FIG. 3, the larger width the opening portion needs. Thus, when the pad 111 is bonded, a resist pattern is formed to be gradually broader toward an upper part in the figure by counting backward from an opening width that can attain a sufficient strength.

In more detail, the pad portion is opened by such steps as follows.

Figure 4:
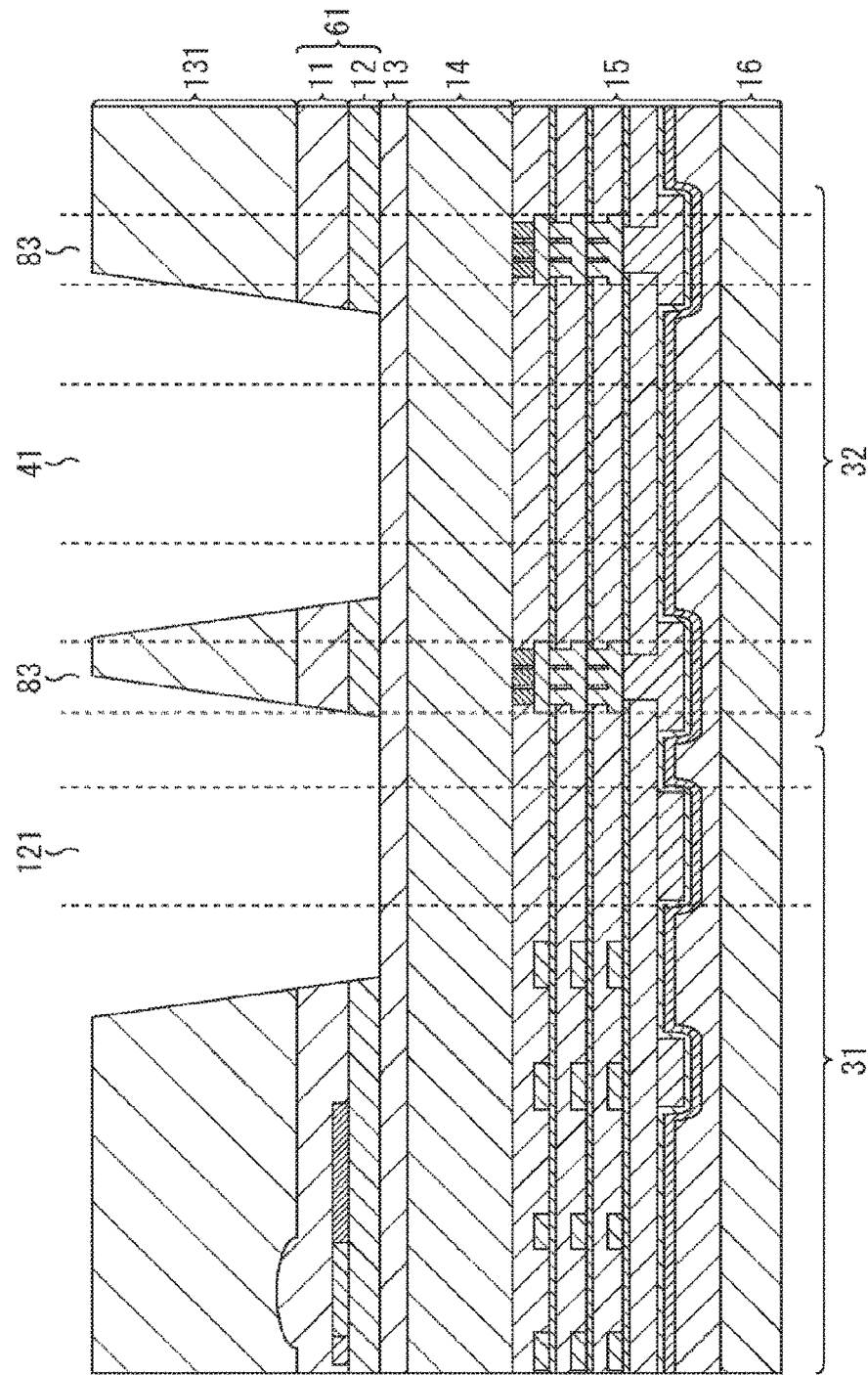
FIG. 4 is a view for explaining a method for exposing a tap of the conventional solid-state image pickup device.

Specifically, as shown in FIG. 4, at a first step, on an upper surface of the lens material layer 61 of the back-side-illuminated solid-state image pickup element in the figure, a pattern of a resist layer 131 with a larger opening width corresponding to the opening widths of the opening portions Z1 and Z2 is formed to etch the lens material layer 61.

Hereafter, the pad portion 121 and the blade region 41 are etched by a similar method to form the opening portions Z3 and Z4, and only the pad portion 121 is further etched to form the opening portion Z5, thereby bringing the pad 111 into a state of being exposed.

Incidentally, for taking out more solid-state image pickup elements 31 from the same wafer, a preferable configuration is having a width of the guard ring 83 made smaller to dispose the pad portion 121 and the blade region 41 close to each other.

Figure 5:
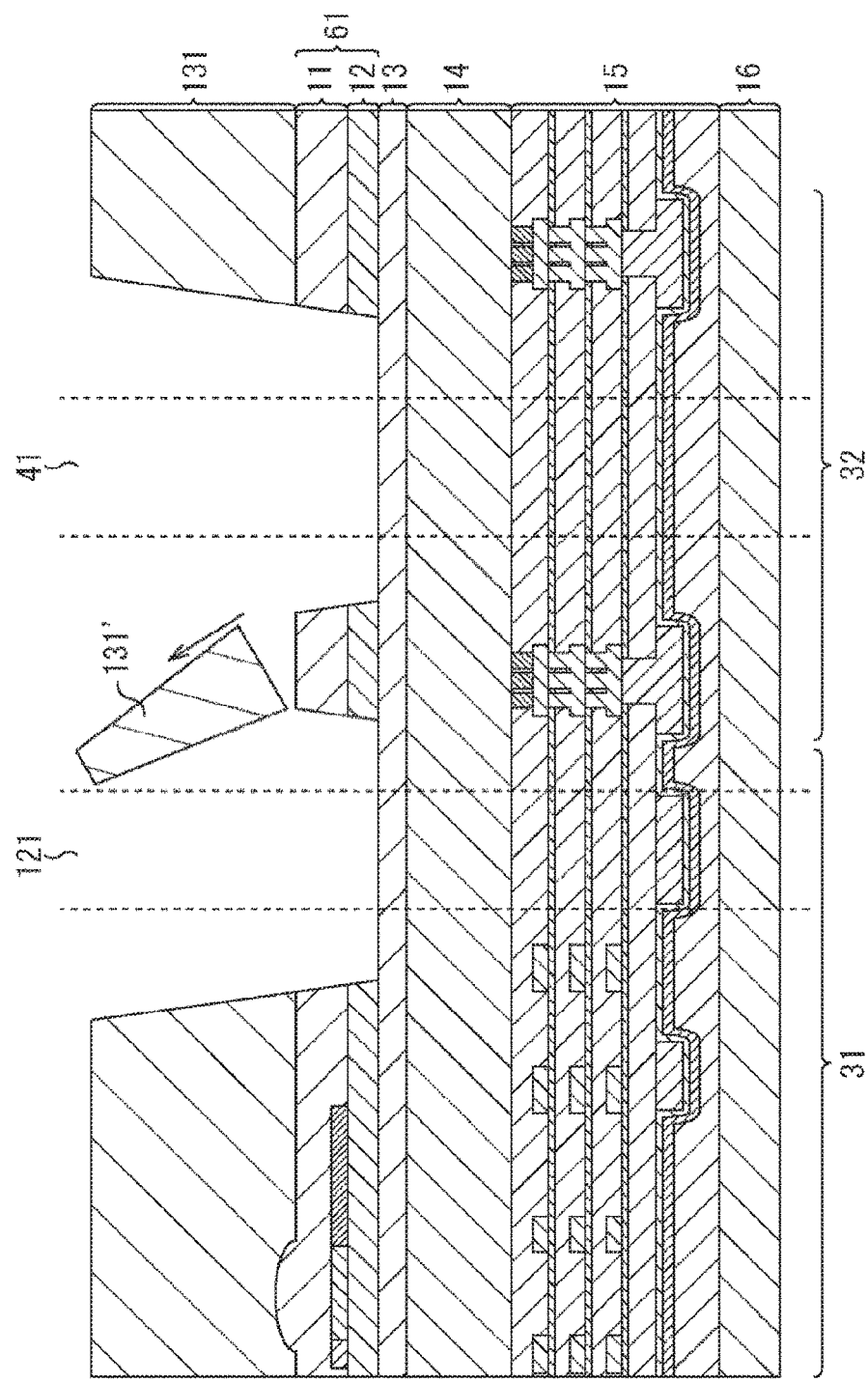
FIG. 5 is a view for explaining an example where in the method for opening a tap of the conventional solid-state image pickup device, a resist layer flies.

However, when the pad portion 121 and the blade region 41 are disposed close to each other, a distance between the pad portion 121 and the blade region 41 is too short to make a resist layer 131' be thin to peel off from the lens material layer 61 and collapse to cause so-called a resist collapse in some cases as shown, for example, in FIG. 5.

Figure 6:
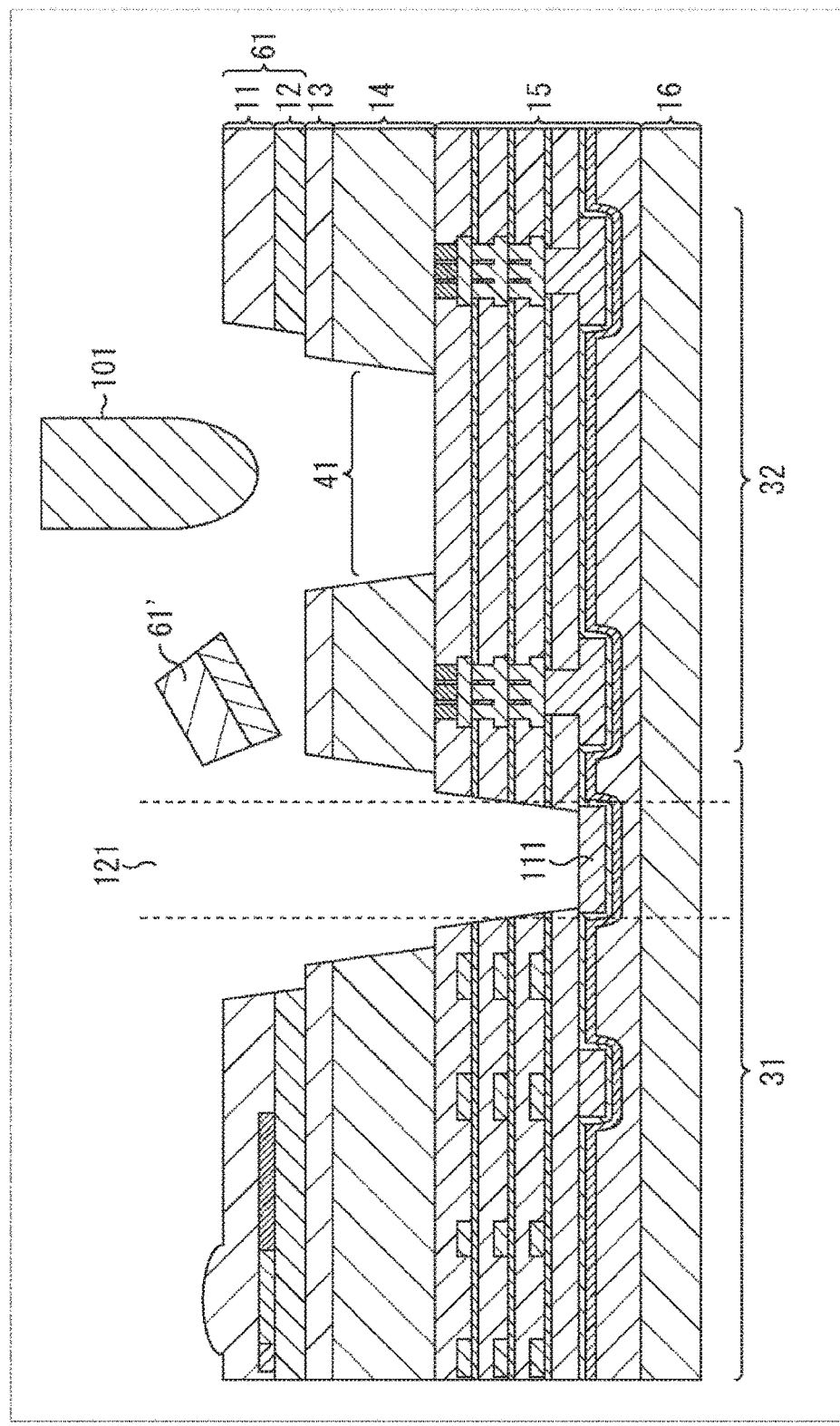
FIG. 6 is a view for explaining an example where in the method for opening a tap of the conventional solid-state image pickup device, a lens material layer flies.

Additionally, as shown in FIG. 6, when the dicing blade 101 cuts into the blade region 41, a lens material layer 61' between the pad portion 121 and the blade region 41 peels off and comes out from the inorganic passivation layer 13 in some cases.

In any case, the collapsed resist layer 131' or peel-off of the lens material layer 61' possibly invites not only a defective appearance but also a defective pixel as a result of attachment of dusts to a top face of the pixel portion 51 of the solid-state image pickup element 31. As a result, yields in manufacturing the solid-state image pickup element 31 is reduced to possibly increase costs.

<Processing of Pad Portion of the Present Technology>

Next, description will be made of a processing step, as a part of a method for manufacturing a solid-state image pickup element which is a semiconductor device to which the present technology is applied, the step of bringing a pad present at a position deeper than a wafer top face into a state of being exposed for wire-bonding. In addition, description will be here made of a processing step of opening a connecting pad in each of solid-state image pickup elements, which solid-state image pickup elements as semiconductor devices are formed as a plurality of semiconductor chips in a semiconductor substrate.

In the present technology, in order to increase yields and reduce costs as described above, first etching is conducted using the resist layer 131 formed with a pattern having a resist opened so as to connect the pad portion 121 and the blade region 41 at the time of processing thereof, thereby forming, in the lens material layer 61, an opening portion connecting the pad portion 121 and the blade region 41.

Next, second etching is conducted using the resist layer 131 provided with the opening portion so as to make the pad portion 121 and the blade region 41 separate regions, so that opening portions separating the pad portion 121 and the blade region 41 are formed in the passivation layer 13 and the semiconductor substrate 14. At this time point, the blade region 41 is supposed to have a layer removed which causes chipping or clogging. Then, using the resist layer 131 provided with the opening portion only in the pad portion 121, third etching forms an opening portion which exposes the pad 111 electrically connecting the solid-state image pickup element 31.

Figure 7:
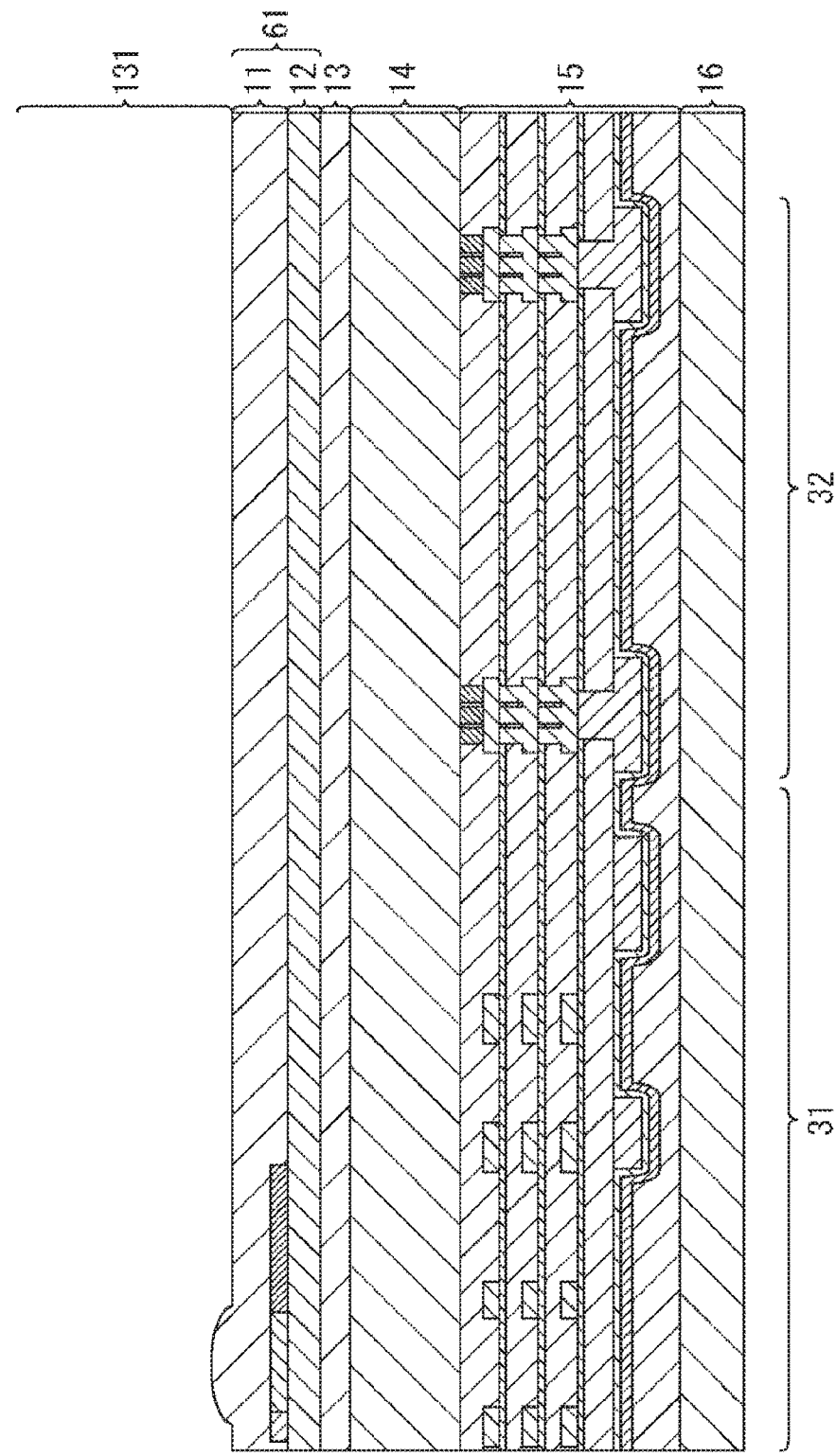
FIG. 7 is a view for explaining a first embodiment in which a tap of the semiconductor device to which the present technology is applied is opened.
Figure 8:
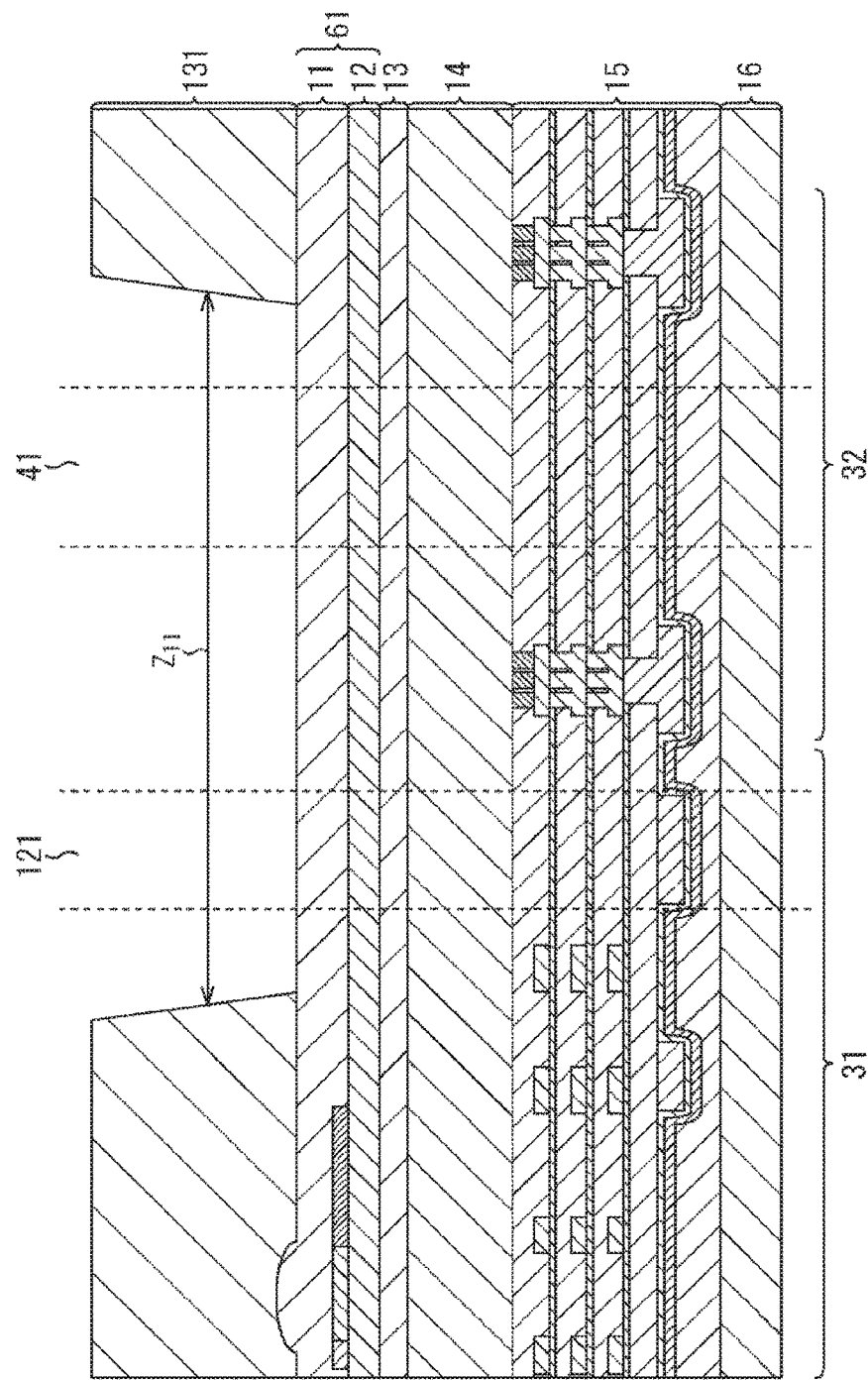
FIG. 8 is a view for explaining the first embodiment in which the tap of the semiconductor device to which the present technology is applied is opened.

In more detail, at a first step, in an upper part of the lens material layer 61 yet to be processed as shown in FIG. 7, the resist layer 131 is laminated which is formed with a pattern having a resist opened to be formed of an opening portion Z11 with an opening width (and shape) connecting the pad portion 121 and the blade region 41 at the time of processing thereof as shown in FIG. 8.

Figure 9:
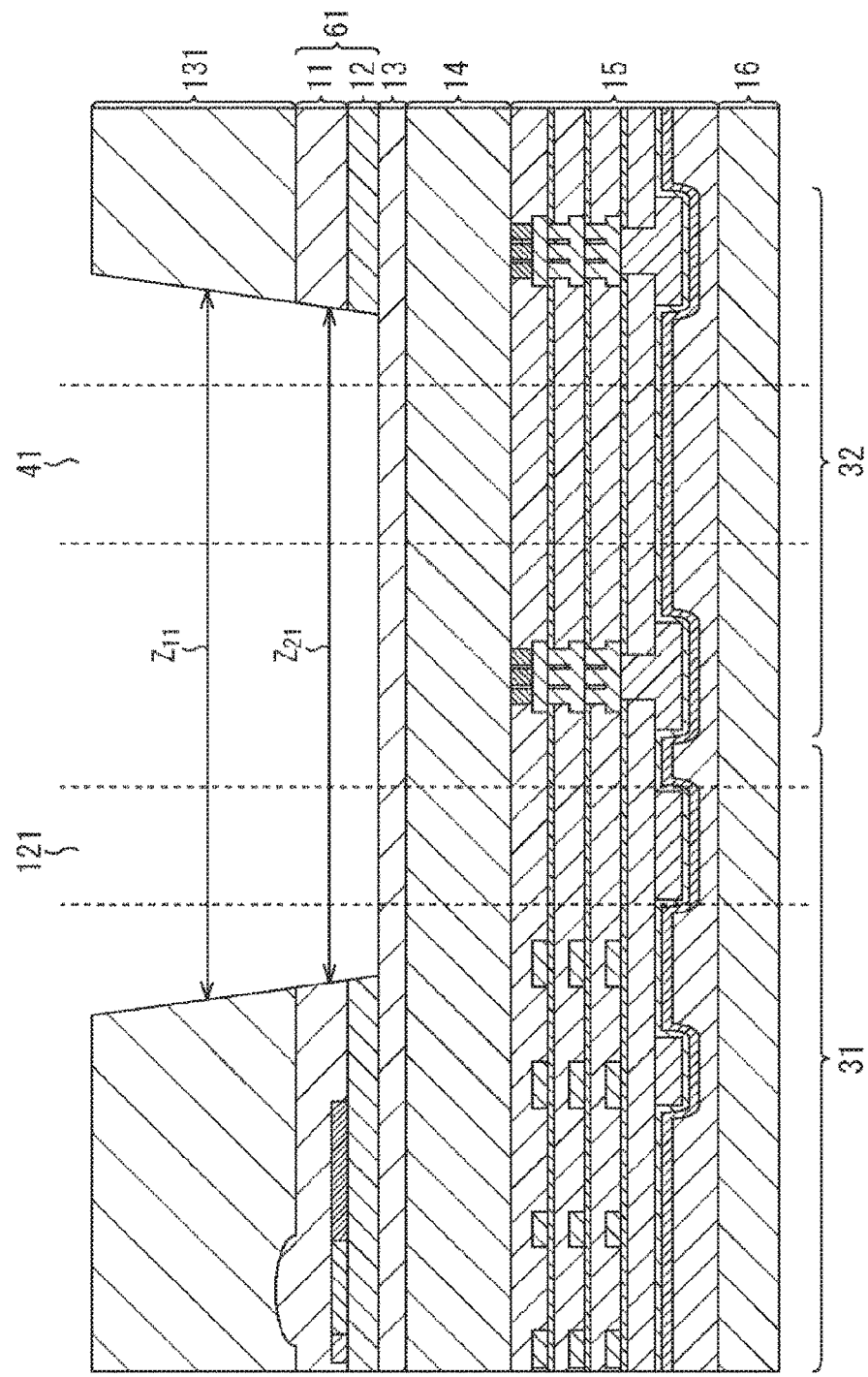
FIG. 9 is a view for explaining the first embodiment in which the tap of the semiconductor device to which the present technology is applied is opened.

At a second step, using the resist layer 131 of FIG. 8, the first etching forms, in the lens material layer 61, an opening portion Z21 connecting the pad portion 121 and the blade region 41 as shown in FIG. 9.

Figure 10:
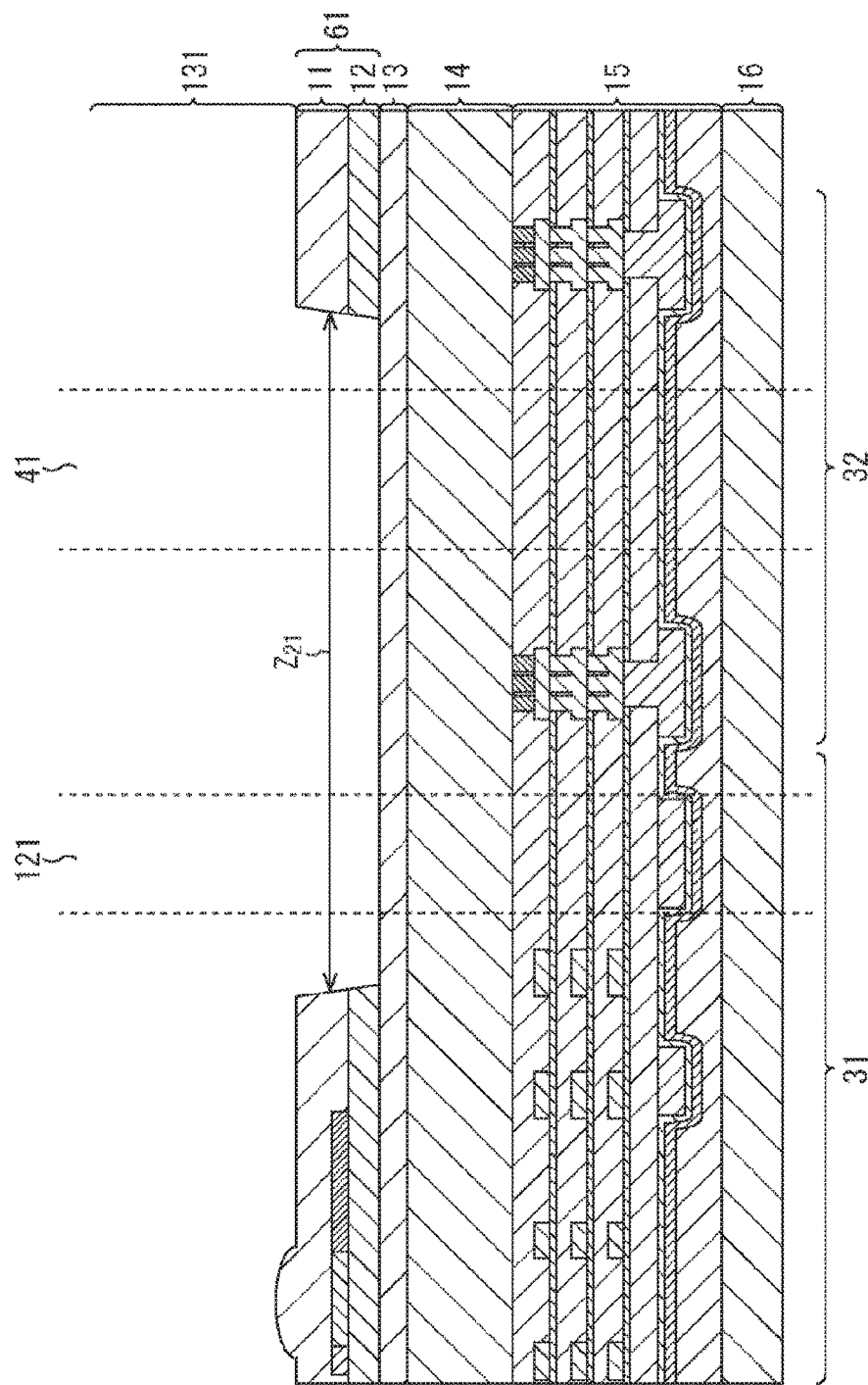
FIG. 10 is a view for explaining processing for opening the tap of the semiconductor device to which the present technology is applied.

At a third step, the resist layer 131 of FIG. 9 is peeled off, and as shown in FIG. 10, the lens material layer 61 is formed, as an uppermost layer in the figure, having the opening portion Z21 etched which connects the pad portion 121 and the blade region 41.

Figure 11:
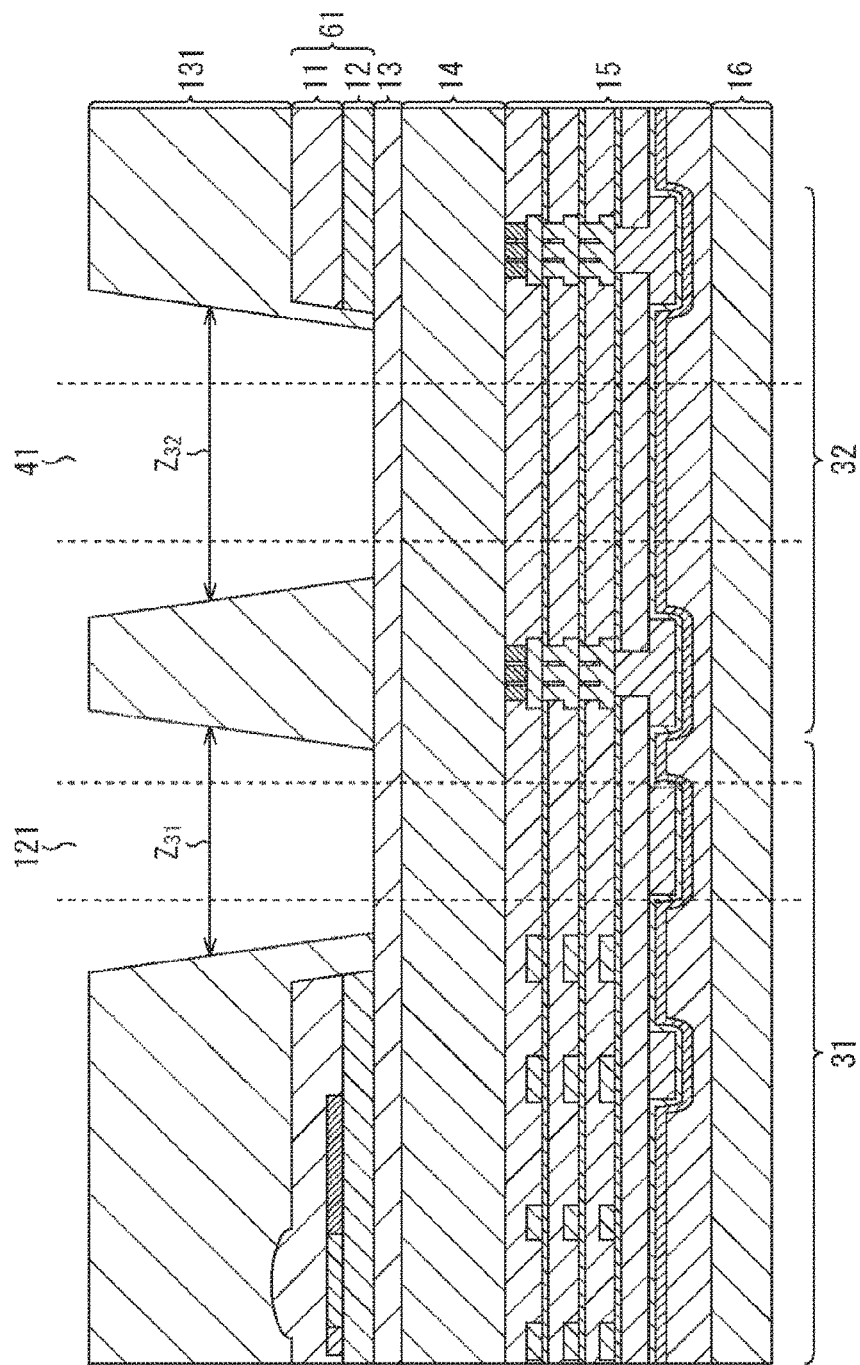
FIG. 11 is a view for explaining the first embodiment in which the tap of the semiconductor device to which the present technology is applied is opened.

At a fourth step, further on the uppermost layer shown in FIG. 10, the resist layer 131 is formed having opening portions Z31 and Z32 provided in the pad portion 121 and the blade region 41, respectively, as shown in FIG. 11. In addition, as shown in FIG. 11, a part of the resist layer 131 is formed also in the lens material layer 61.

Figure 12:
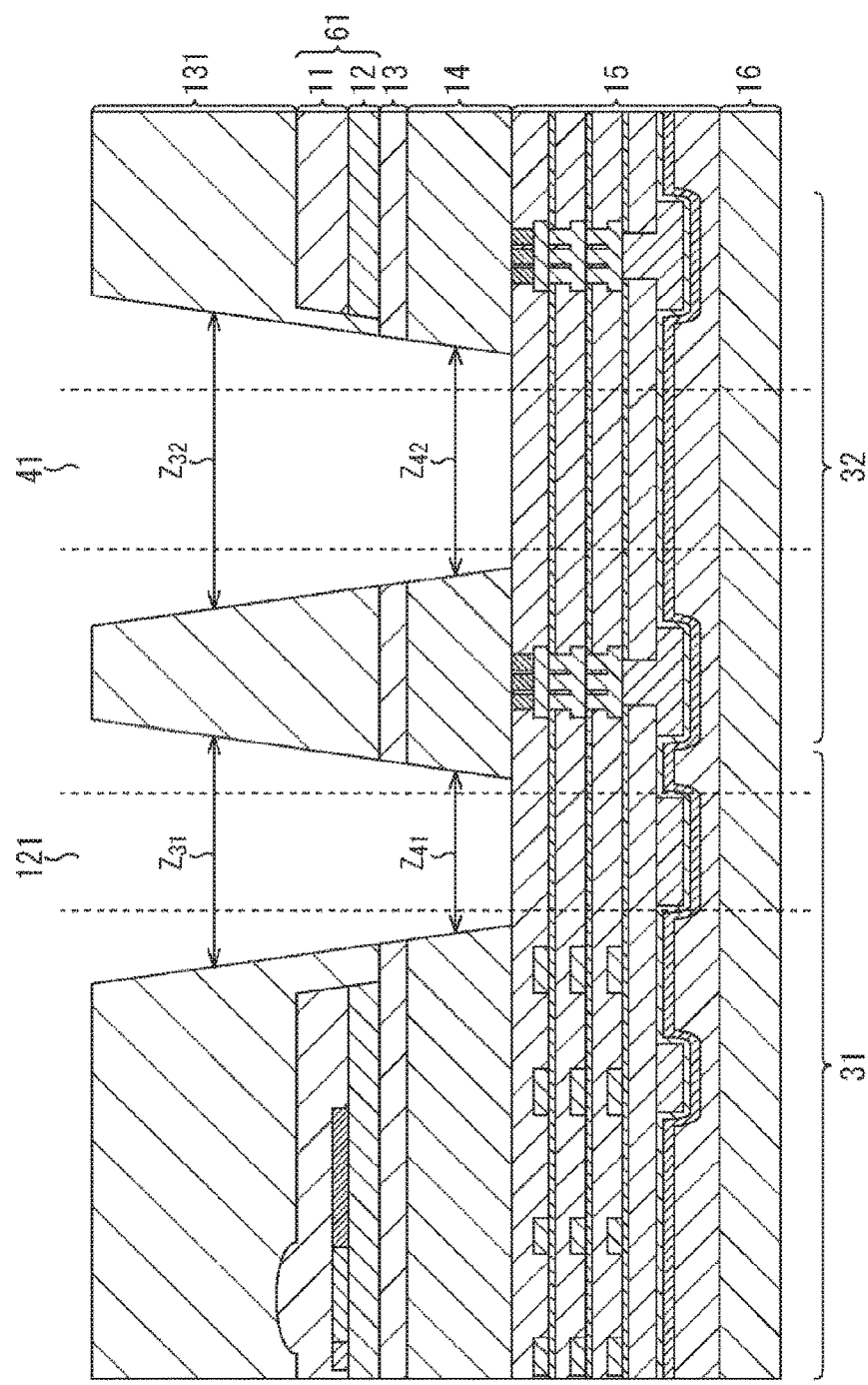
FIG. 12 is a view for explaining the first embodiment in which the tap of the semiconductor device to which the present technology is applied is opened.

At a fifth step, using the resist layer 131 of FIG. 11, the second etching of the passivation layer 13 and the semiconductor substrate 14 forms opening portions Z41 and Z42 in the pad portion 121 and the blade region 41, respectively, as shown in FIG. 12.

Figure 13:
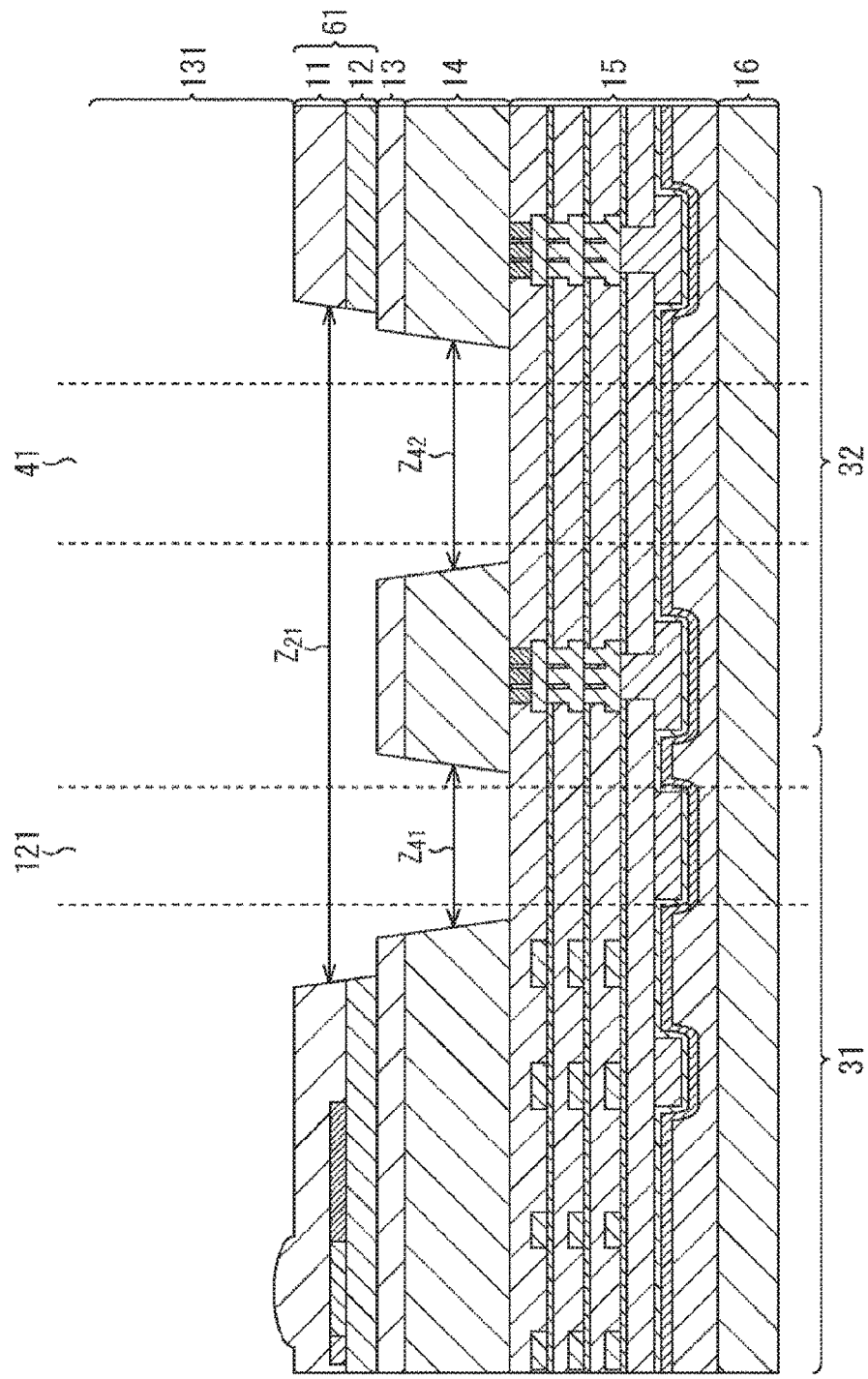
FIG. 13 is a view for explaining the first embodiment in which the tap of the semiconductor device to which the present technology is applied is opened.

At a sixth step, peel-off of the resist layer 131 of FIG. 12 forms the opening portion Z21 connecting the pad portion 121 and the blade region 41 in the lens material layer 61 as the uppermost layer, and further forms the opening portions Z41 and Z42, respectively, in the pad portion 121 and the blade region 41 of the passivation layer 13 and the semiconductor substrate 14 as shown in FIG. 13.

Figure 14:
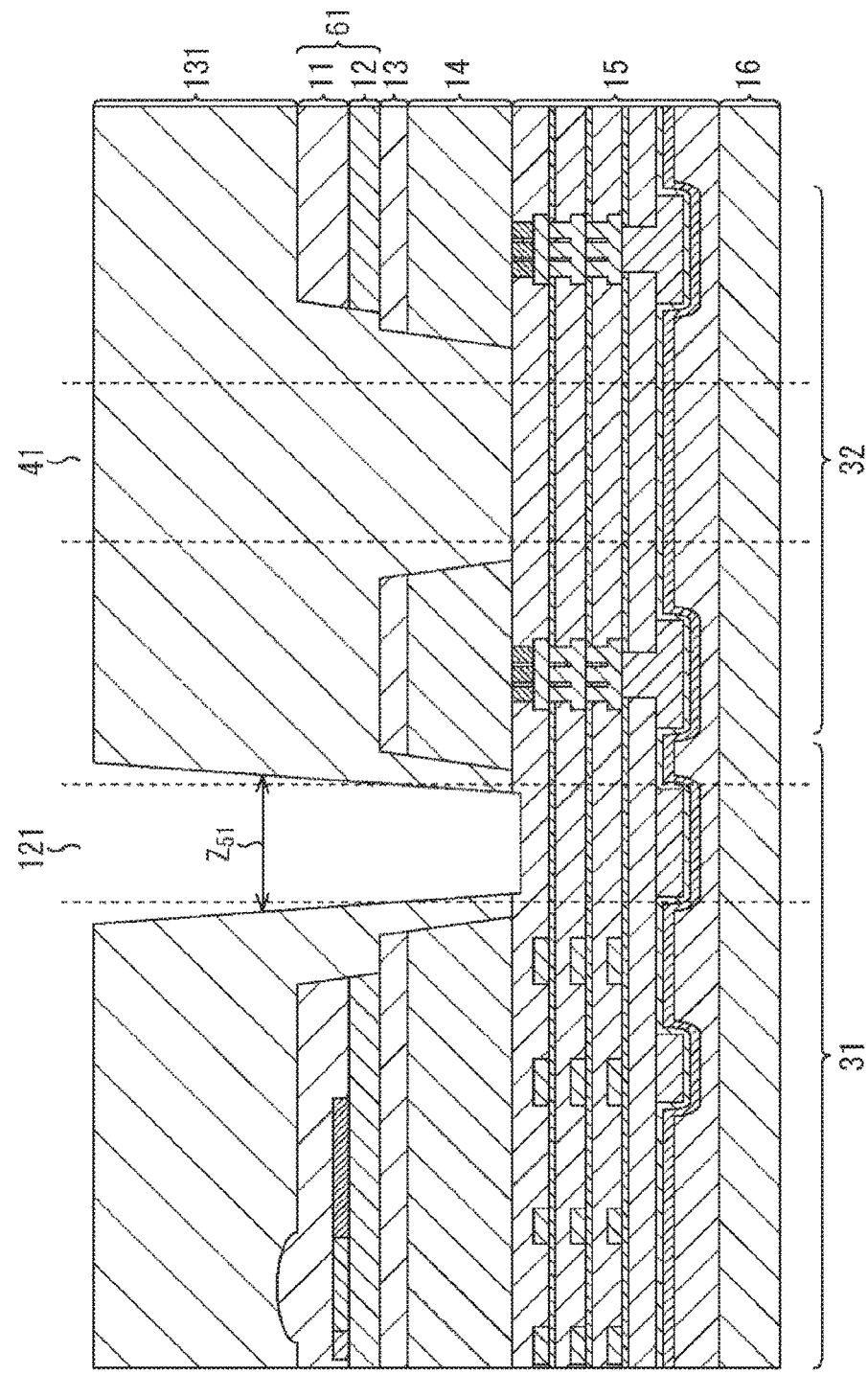
FIG. 14 is a view for explaining the first embodiment in which the tap of the semiconductor device to which the present technology is applied is opened.

At a seventh step, on the uppermost layer shown in FIG. 13, the resist layer 131 is formed with an opening portion Z51 provided only in the pad portion 121 as shown in FIG. 14.

At an eighth step, using the resist layer 131 of FIG. 14, the third etching forms, in the pad portion 121 of the wiring layer 15, an opening portion Z61 which brings the pad 111 into a state of being exposed. This brings the pad 111 into a state of being electrically connectable. Then, peel-off of the resist layer 131 of FIG. 14 forms the opening portion Z21 connecting the pad portion 121 and the blade region 41 in the lens material layer 61 of the back-side-illuminated solid-state image pickup element shown in FIG. 15. Additionally, in the passivation layer 13 and the semiconductor substrate 14, the opening portions Z41 and Z42 are separately formed in regions of the pad portion 121 and the blade region 41, respectively. Then, the opening portion Z61 is formed in the pad portion 121 of the wiring layer 15 to bring the pad 111 into a state of being exposed at the bottom of the opening portion Z61.

As described in the foregoing, using the resist layer 131 formed with the opening portion Z11 formed to connect the pad portion 121 and the blade region 41 at the first step to the third step, the first etching forms, in the lens material layer 61, the opening portion Z21 connecting the pad portion 121 and the blade region 41, thereby completely removing the resist layer 131 and the lens material layer 61 which might become dusts. Additionally, by the second etching, the passivation layer 13 and the semiconductor substrate 14 which might form dusts are removed from the blade region 41 by the dicing blade 101, and also the opening portion Z41 in the pad portion 121 is formed. Further, the third etching forms the opening portion Z61 in the wiring layer 15.

This prevents an appearance from becoming defective, which is caused by peel-off of the resist layer 131 or the lens material layer 61. Additionally, this prevents dusts, which are generated when the passivation layer 13 or the semiconductor substrate 14 is diced by the dicing blade, from attaching to a top face of the pixel portion 51 of the solid-state image pickup element 31 to have a defective pixel.

As a result, yields in manufacturing the solid-state image pickup element 31 can be increased to reduce costs.

In addition, the description has been made in the foregoing with respect to an example where in the lens material layer 61, the first etching forms the opening portion Z21 so as to connect the pad portion 121, the blade region 41, and an area therebetween, and in the passivation layer 13, the semiconductor substrate 14, and the wiring layer 15, the second and following etching forms the separate opening portions Z41, Z42 and Z61 in regions of the pad portion 121 and the blade region 41, respectively.

However, in a case of a layered structure in which a plurality of more layers are laminated than the lens material layer 61, the passivation layer 13, the semiconductor substrate 14, and the wiring layer 15, an opening portion in each of the pad portion 121 and the blade region 41 may be formed by three or more times of etching with the layers sectioned for etching. In this case, an opening portion may be formed so as to connect the pad portion 121, the blade region 41, and an area therebetween by not only the first etching but also more times of etching.

For example, in a case where the solid-state image pickup element is formed of a material including a total of five layers, five times of etching may form an opening portion in each layer in the pad portion 121 and the blade region 41. Additionally, in this case, the first and second etching may form an opening portion so as to connect the pad portion 121, the blade region 41, and an area therebetween. Such processing enables generation of dusts to be suppressed even when the pad portion 121 and the blade region 41 are closer to each other.

<First Manufacturing Example>

Figure 16:
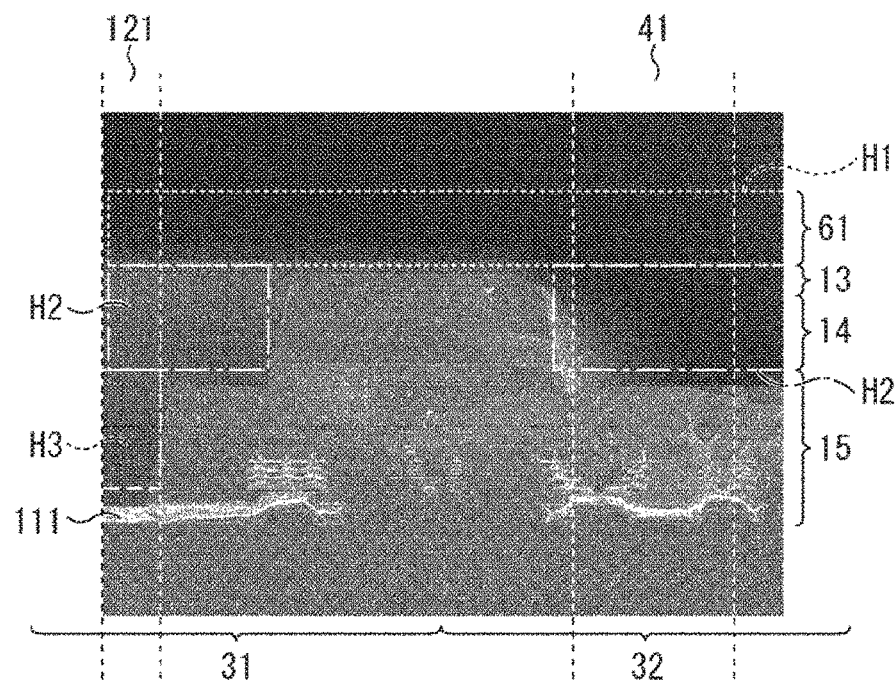
FIG. 16 is a view for explaining an image of the tap opened in the semiconductor device to which the present technology is applied.

The above-described processing of a pad portion of the solid-state image pickup element 31 enables manufacturing of such solid-state image pickup element 31 as shown in FIG. 16, for example.

In addition, in FIG. 16, after a layer H1 is etched to be opened, the layer being configured with the opening portion connecting the pad portion 121 and the blade region 41, and being formed of the lens material layer 61, a layer H2 is etched which is configured with the separate pad portion 121 and blade region 41 and formed of the inorganic passivation layer 13 and the semiconductor substrate 14. Then, lastly, a layer H3 formed of the wiring layer 15 only in the pad portion 121 is etched to expose the pad 111.

The foregoing configuration avoids scattering dusts and peel-off of an undercoat from a passivation film which are caused by cutting into the blade region 41 of the scribe line 32 by the dicing blade 101. As a result, attachment of dusts to the pixel portions 51 is prevented, so that yields in manufacturing of the solid-state image pickup elements 31 can be increased to reduce costs.

<Second Manufacturing Example>

In the first Manufacturing Example, for example, together with the layer H1 formed with the lens material layer 61, the layer H2 formed with the inorganic passivation layer 13 and the semiconductor substrate 14 may be formed as an opening portion connecting the pad portion 121 and the blade region 41.

Figure 17:
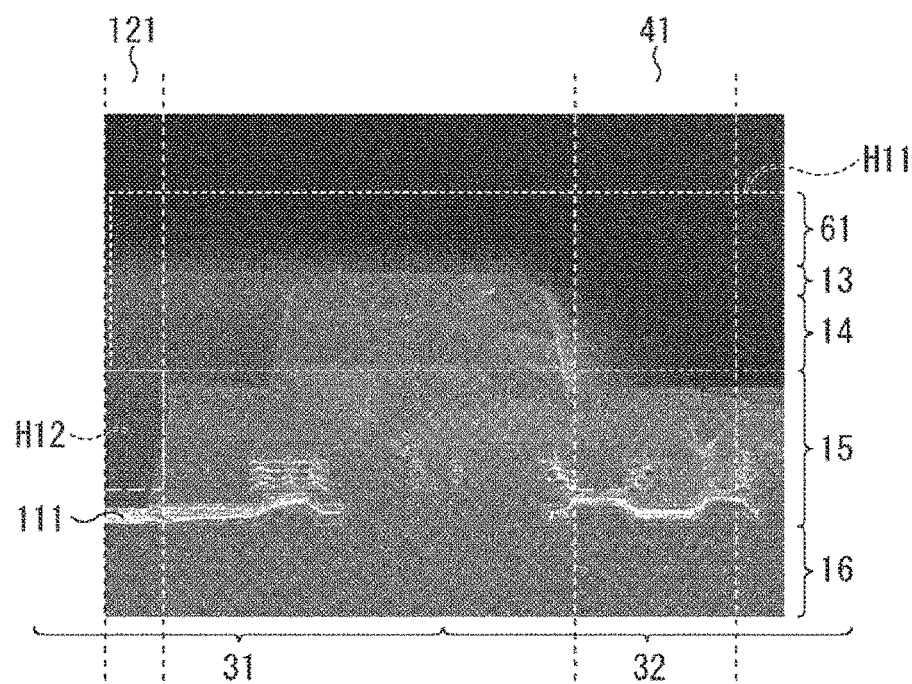
FIG. 17 is a view for explaining an image of the tap opened in the semiconductor device to which the present technology is applied.

FIG. 17 shows a manufacturing example of the solid-state image pickup element 31 in which together with the layer H1 formed with the lens material layer 61 in FIG. 16, the layer H2 formed with the inorganic passivation layer 13 and the semiconductor substrate 14 is formed as an opening portion connecting the pad portion 121 and the blade region 41.

Specifically, after every part of a layer H11 formed with the lens material layer 61, the inorganic passivation layer 13 and the semiconductor substrate 14 is etched as an opening portion connecting the pad portion 121 and the blade region 41, only a layer H12 in the pad portion 121 formed of the wiring layer 15 is etched to expose the pad 111 to be opened.

Also in this case, yields in manufacturing of the solid-state image pickup elements 31 can be similarly increased to reduce costs.

In addition, in FIG. 17, the description has been made using a captured image of FIG. 16. Therefore, in more detail, in the second manufacturing example of FIG. 17, unlike the first manufacturing example, a protrusion portion of the first manufacturing example, which is included in the layer H11 in the image shown in FIG. 17, is assumed to have a shape cut off by etching.

Second Embodiment

Although in the foregoing, the description has been made of the configuration of the back-side-illuminated solid-state image pickup element, the similar method is also applicable to that of a front-side-illuminated type.

Figure 18:
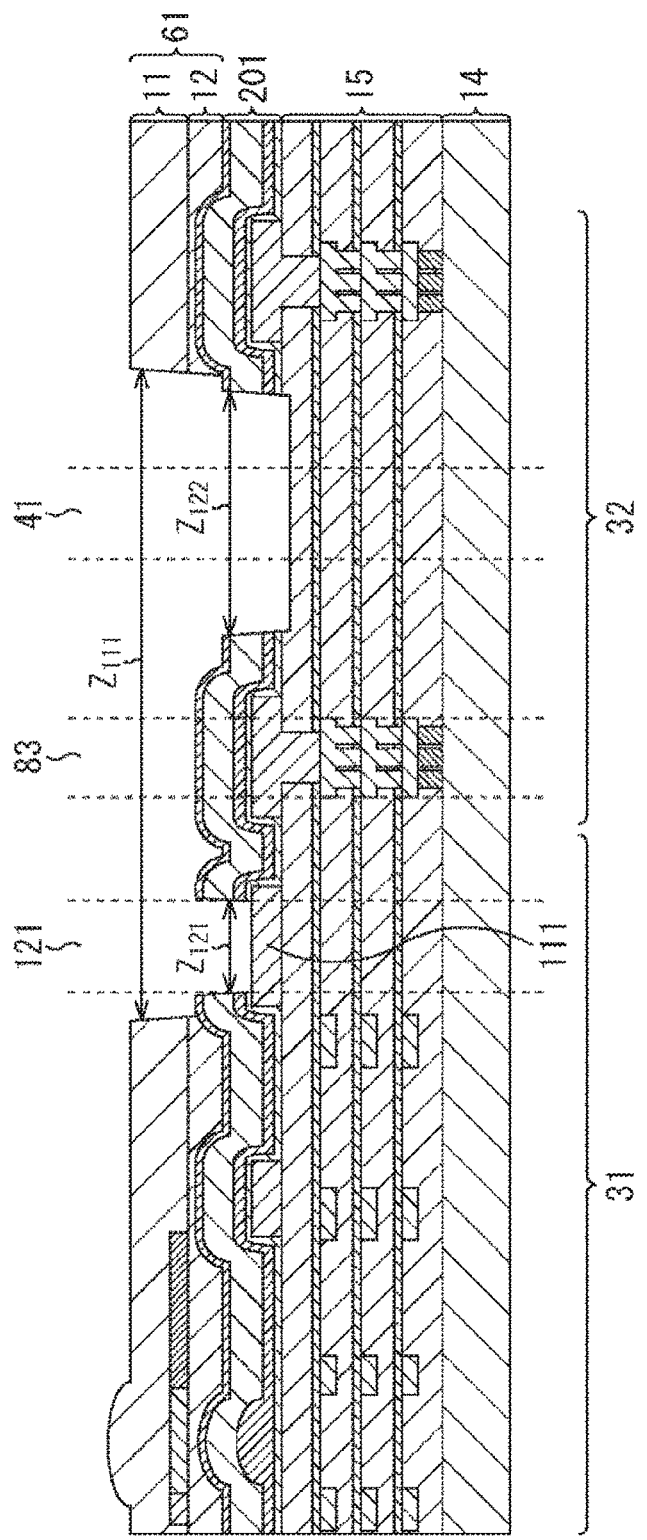
FIG. 18 is a view for explaining a second embodiment in which the tap of the semiconductor device to which the present technology is applied is opened.

FIG. 18 is a schematic side sectional view of a front-side-illuminated solid-state image pickup element. In addition, in FIG. 18, components having the same functions as those in FIG. 15 are identified by the same names and reference numerals to appropriately omit description thereof.

Figure 15:
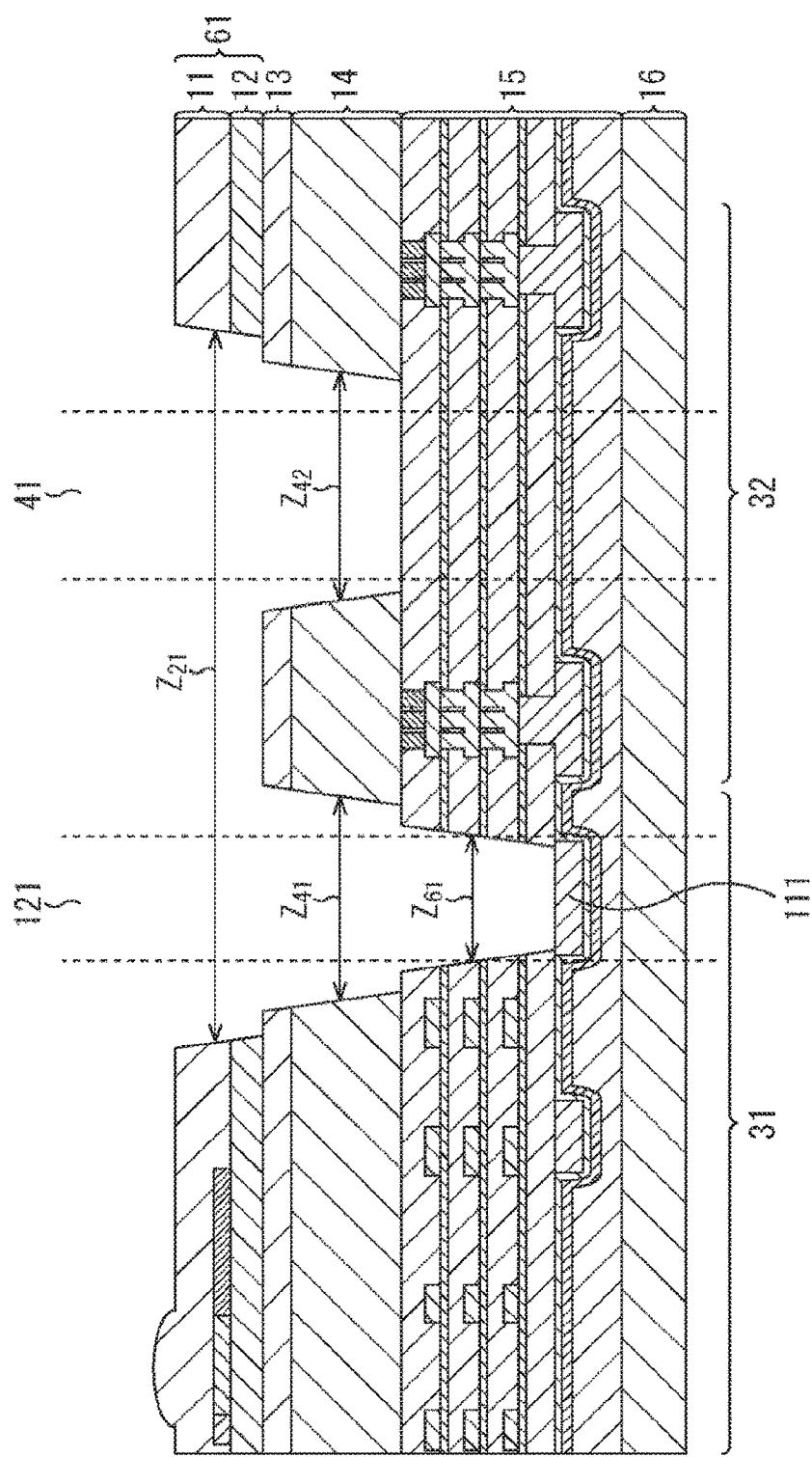
FIG. 15 is a view for explaining the first embodiment in which the tap of the semiconductor device to which the present technology is applied is opened.

Specifically, the front-side-illuminated solid-state image pickup element in FIG. 18 differs from the back-side-illuminated solid-state image pickup element in FIG. 15 in that in place of a semiconductor substrate 14, a wiring layer 201 is provided. In addition, the semiconductor substrate 14 including the optical/electrical conversion portion 81 is provided in a lowermost part in the figure.

Then, in a case of FIG. 18, by first etching, an opening portion Z111 is formed in a lens material layer 61 so as to include a guard ring 83 and connect a pad portion 121 and a blade region 41. Then, by second etching, opening portions 2121 and 2122 are formed in the pad portion 121 and the blade region 41 of the wiring layer 201, respectively. As a result, a pad 111 is processed to be exposed.

Similarly to the case of manufacturing of a back-side-illuminated solid-state image pickup element, such processing also prevents, in manufacturing of a front-side-illuminated solid-state image pickup element, scattering dusts and peel-off of an undercoat from a passivation film which are caused by cutting into the blade region 41 of a scribe line 32 by a dicing blade 101. As a result, relevant yields can be increased to reduce costs.

Third Manufacturing Example

Figure 19:
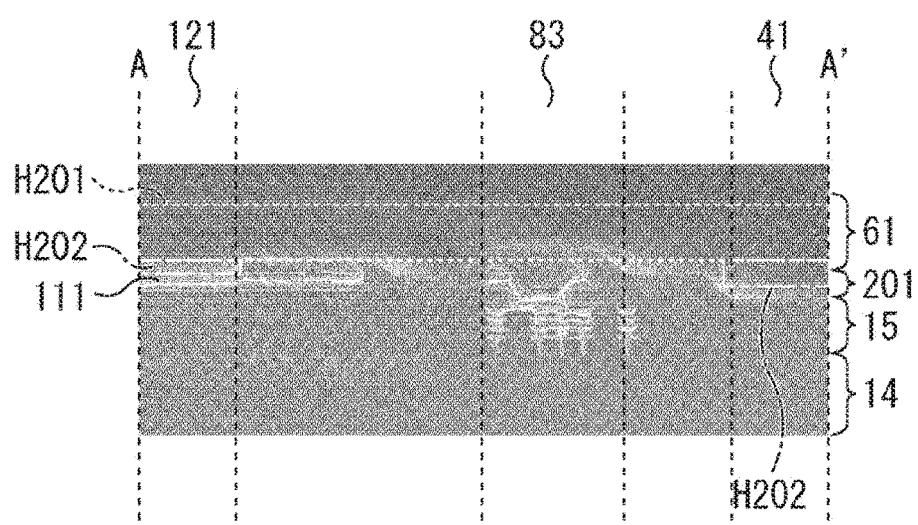
FIG. 19 is a view for explaining an image of the tap opened in the semiconductor device to which the present technology is applied.

The above-described processing of a pad portion of the solid-state image pickup element 31 enables manufacturing of such front-side-illuminated solid-state image pickup element 31 as shown in FIG. 19, for example.

As shown in the side section of FIG. 19, the first etching peels a layer H201 formed with the lens material layer 61 to be opened, with the pad portion 121 and the blade region 41 connected, and the second etching peels a layer H202 to be opened, which layer is formed with the wiring layer 201 including only the pad portion 121. This results in opening the pad 111 in a state of being exposed.

Figure 20:
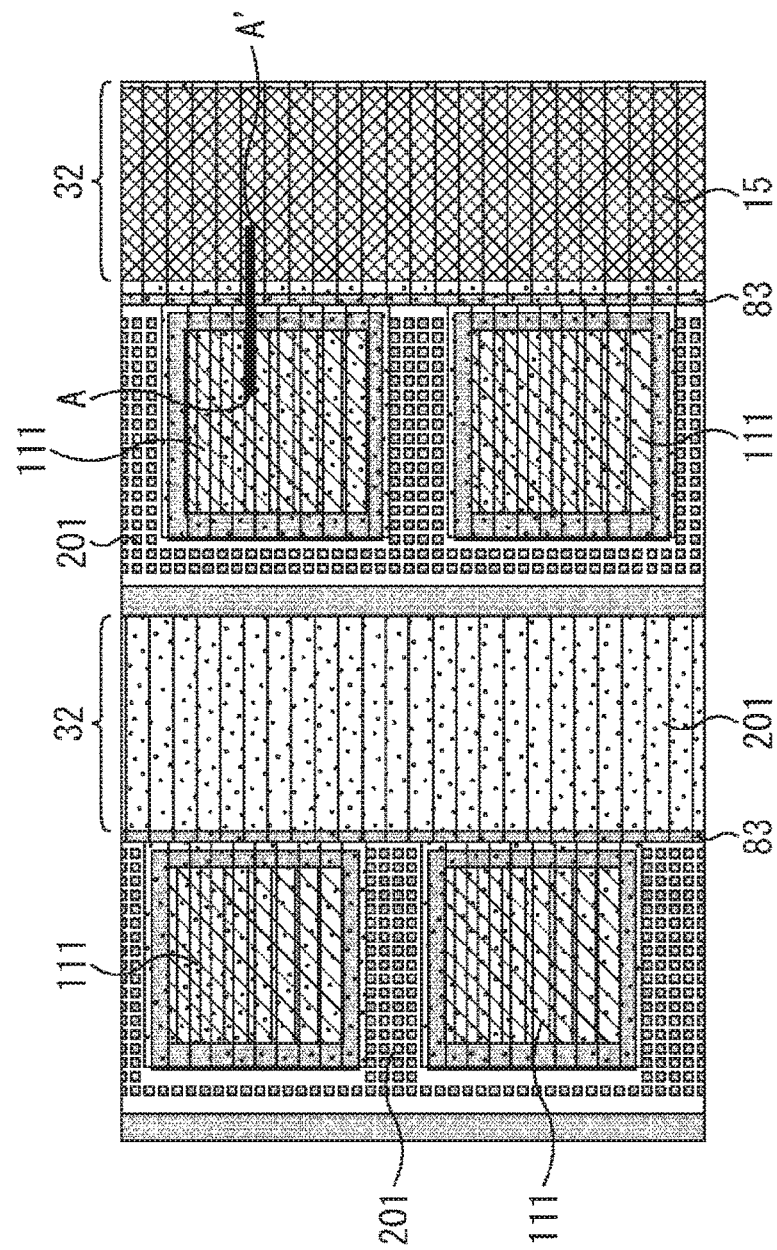
FIG. 20 is a view for explaining a top view of the tap opened in the semiconductor device of FIG. 19.

This state, shown in a top view, is where at a position connecting the pad portion 121 (the pad 111) and the blade region 41 (the scribe line 32), the layer H201 of FIG. 19 is peeled to be opened by the first etching, and on the scribe line 32, the wiring layer 201 is opened in a state of being exposed as illustrated in a left part of FIG. 20. Further, as illustrated in a right part of FIG. 20, the layer H202 formed with the wiring layer 201 including the pad portion 121 (the pad 111) and the blade region 41 (the scribe line 32) is separately etched, so that the pad 111 of the pad portion 121, and a wiring layer 15 in the blade region 41 on the scribe line 32 are opened in a state of being exposed. In addition, FIG. 19 shows a plane taken along AA' at the right part of FIG. 20.

The foregoing processing avoids scattering dusts and peel-off of an undercoat from a passivation film which are caused by cutting into the blade region 41 of the scribe line 32 by the dicing blade 101 also in the front-side-illuminated solid-state image pickup element. As a result, yields in manufacturing can be increased to reduce costs.

Third Embodiment

Although in the foregoing, the description has been made of the configurations of the back-side-illuminated solid-state image pickup element and the front-side-illuminated solid-state image pickup element including a single layer as a wiring layer, a solid-state image pickup device may be applied which, for example, is formed with a three-dimensional mounting substrate with an additional logic substrate laminated.

Figure 21:
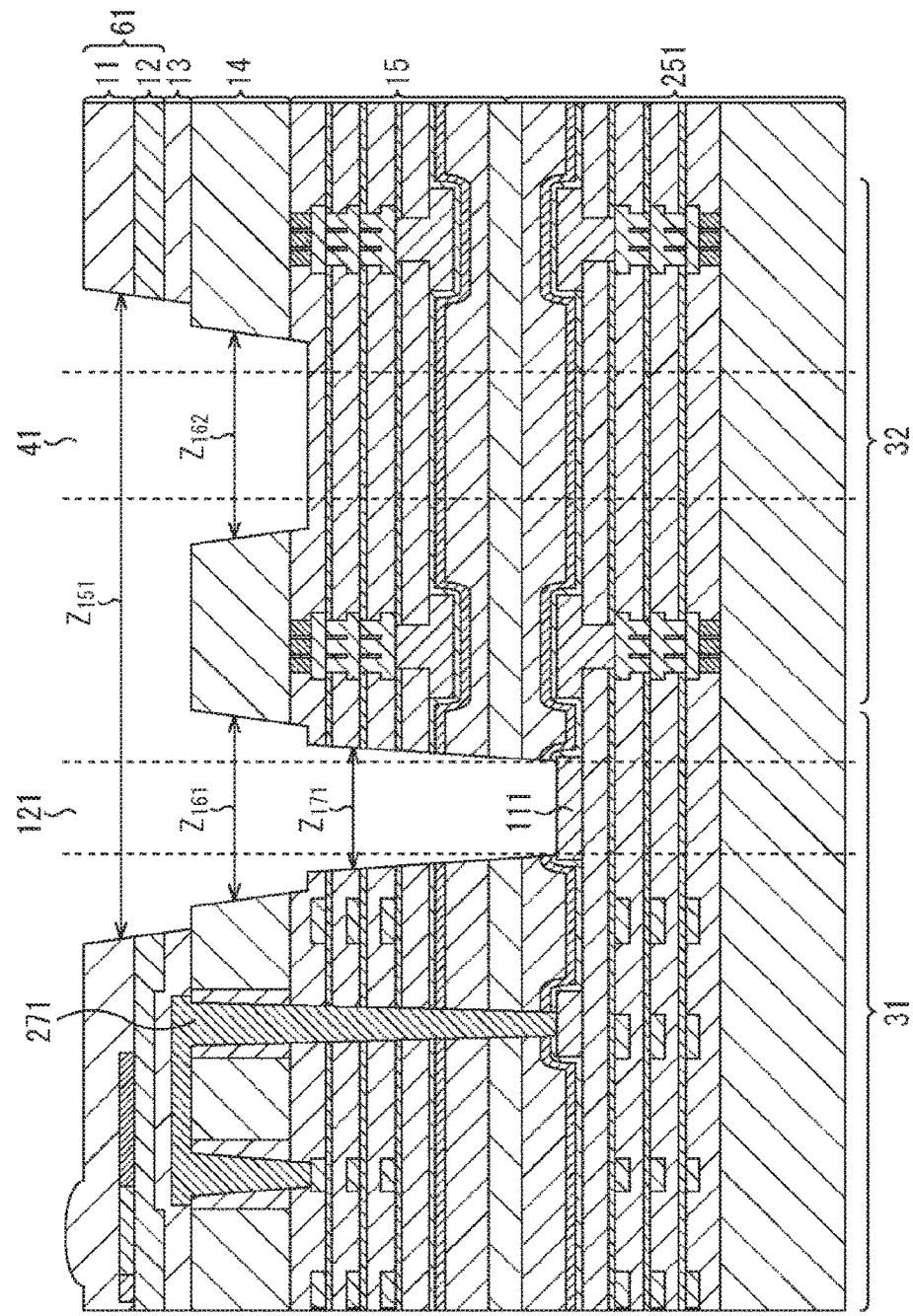
FIG. 21 is a view for explaining a third embodiment in which the tap of the semiconductor device to which the present technology is applied is opened.

FIG. 21 is a schematic side sectional view of a back-side-illuminated solid-state image pickup element 31 formed with a three-dimensional mounting substrate. In addition, in a solid-state image pickup element 31 of FIG. 21, components having the same functions as those of the solid-state image pickup element 31 in FIG. 15 are identified by the same names and reference numerals to appropriately omit description thereof. Specifically, difference in FIG. 21 from the solid-state image pickup element 31 of FIG. 15 is that under a wiring layer 15, a logic substrate 251 including a supporting substrate is provided. The logic substrate 251 is electrically connected with a wire in the wiring layer 15 via a through electrode 271, through which through electrode 271, a pixel signal generated on the basis of electric charges generated by an optical/electrical conversion portion 22 of the solid-state image pickup element 31 is output to the logic substrate 251.

In the manufacturing of the solid-state image pickup element 31 in FIG. 21, similarly to FIG. 15, first etching forms an opening portion Z151 connecting a pad portion 121 and a blade region 41, and second etching forms, in a semiconductor substrate 14, separate opening portions Z161 and Z162 in the pad portion 121 and the blade region 41, respectively.

Then, third etching forms an opening portion Z171 in the wiring layer 15 and a wiring layer of the logic substrate 251, thereby bringing a pad 111 of the logic substrate 251 into a state of being exposed.

Similarly to the case of manufacturing of a back-side-illuminated solid-state image pickup element and a front-side-illuminated solid-state image pickup element, such processing also prevents, in manufacturing of a solid-state image pickup element formed with a three-dimensional mounting substrate, scattering dusts and peel-off of an undercoat from a passivation film which are caused by cutting into the blade region 41 of a scribe line 32 by a dicing blade 101. As a result, relevant yields can be increased to reduce costs.

Fourth Manufacturing Example

Figure 22:
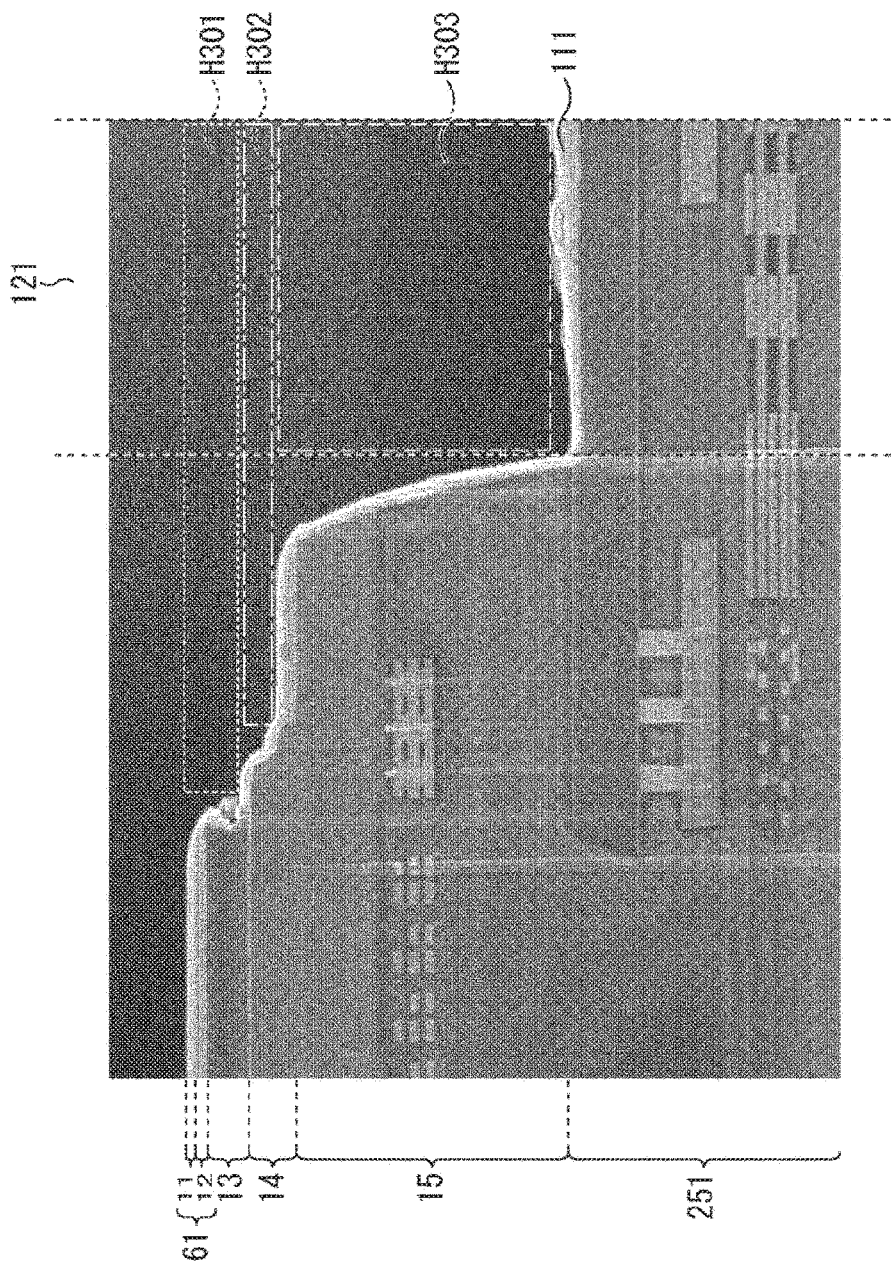
FIG. 22 is a view for explaining an image of the tap opened in the semiconductor device to which the present technology is applied.

FIG. 22 shows a schematic side section of a manufacturing example in which processing is specifically conducted for exposing the pad 111 of the solid-state image pickup element 31 formed with a three-dimensional mounting substrate.

As shown in FIG. 22, the first etching peels a layer H301 formed with a lens material layer 61 and a passivation layer 13 to be opened. Additionally, the second etching peels a layer H302 formed with the semiconductor substrate 14 to be opened. Then, the third etching peels a layer H303 formed with the wiring layer 15 and a wiring layer of the logic substrate 251 to open the pad 111 of the logic substrate 251 so as to be exposed.

With such processing, even when it is designed to have the blade region 41 and the pad portion 121 close to each other, forming an opening portion including the blade region 41 and the pad portion 121 in the lens material layer 61 and the passivation layer 13 by the first etching enables suppression of dust generation due to a resist layer 131 between the blade region 41 and the pad portion 121, the lens material layer 61, and the passivation layer 13. Additionally, designing the blade region 41 and the pad portion 121 to be close to each other enables an increase in the number of solid-state image pickup elements to be taken out from one wafer.

As a result, it is possible to prevent deformation of an external shape due to dust generation, intrusion of dusts into the pixel portion 51 of the solid-state image pickup element 31, and the like, thereby increasing product yields to reduce manufacturing costs.

In addition, the etching work used in the foregoing description can employ either of dry etching and wet etching. Similarly, the etching pattern of the pad portion 121 and the blade region 41 formed in the resist layer 131 may use a positive photoresist, a negative photoresist, or a hard mask formed of an inorganic film such as SiO or SiN.

As described in the foregoing, a back-side-illuminated solid-state image pickup device, a front-side solid-state image pickup element, and a three-dimensional mounting substrate can be manufactured which enable, without placing a pad and a scribe line located deeper than a top face of a wafer at positions away from each other, suppression of ducts generated therebetween.

Additionally, it is also applicable to manufacturing of an integrated circuit chip having passivation of polyimide or the like on a top face thereof.

Further, no need to increase a distance not only between a scribe line and a pad but also between pads also serves as a countermeasure to an increase in a chip size. For example, by forming an inorganic or organic protection film on a top face in the course of a plurality of times of pad etching, it is also possible to increase protection and insulation properties of side walls of opening portions in a pad portion and a blade region.

<Example of Application to Electronic Apparatus>

The above-described solid-state image pickup element is applicable to various kinds of electronic apparatuses including, for example, image pickup devices such as a digital still camera and a digital video camera, a cellular phone having an image pickup function, and another apparatus having an image pickup function.

Figure 23:
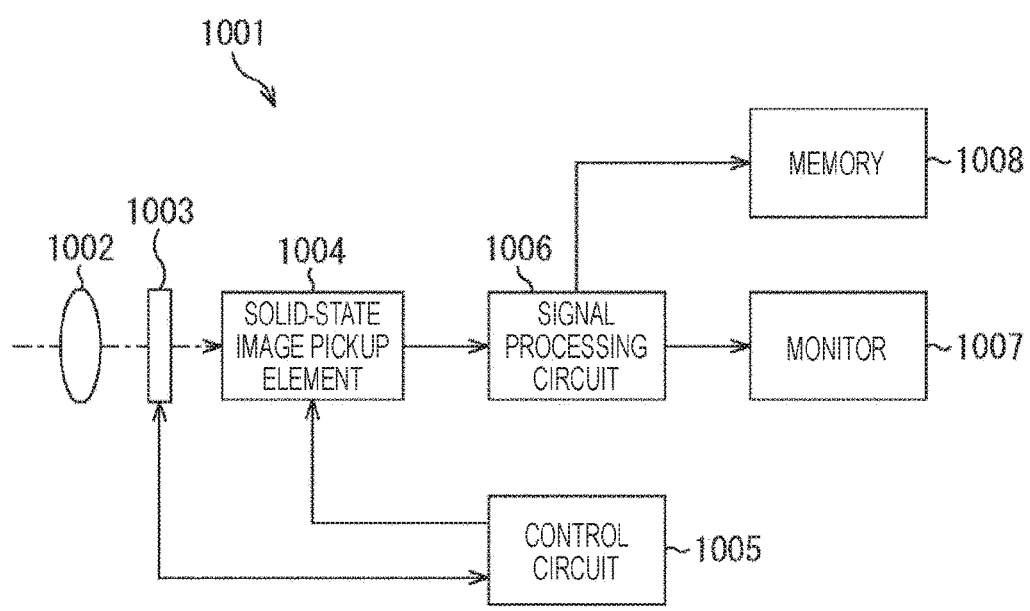
FIG. 23 is a diagram for explaining a configuration of an image pickup device using a solid-state image pickup element formed of a semiconductor image pickup element to which the present technology is applied, and an electronic apparatus.

FIG. 23 is a block diagram showing a configuration example of an image pickup device as an electronic apparatus to which the present technology is applied.

An image pickup device 1001 shown in FIG. 23 is configured to include an optical system 1002, a shutter device 1003, a solid-state image pickup element 1004, a driving circuit 1005, a signal processing circuit 1006, a monitor 1007, and a memory 1008, and is capable of capturing a still image and a moving image.

The optical system 1002, which is configured with one or a plurality of lenses, leads a light (an incident light) from a subject to the solid-state image pickup element 1004 to form an image on a photosensitive surface of the solid-state image pickup element 1004.

The shutter device 1003, which is arranged between the optical system 1002 and the solid-state image pickup element 1004, controls a period of light illumination to the solid-state image pickup element 1004 and a period of light shielding according to control by the driving circuit 1005.

The solid-state image pickup element 1004 is configured with a package including the above-described solid-state image pickup element 31. The solid-state image pickup element 1004 accumulates signal electric charges for a fixed period according to a light whose image is formed on the photosensitive surface via the optical system 1002 and the shutter device 1003. The signal electric charges accumulated in the solid-state image pickup element 1004 are transferred according to a driving signal (timing signal) supplied from the driving circuit 1005.

The driving circuit 1005 outputs a driving signal which controls transfer operation of the solid-state image pickup element 1004 and shuttering operation of the shutter device 1003 to drive the solid-state image pickup element 1004 and the shutter device 203.

The signal processing circuit 1006 executes various kinds of signal processing with respect to signal electric charges output from the solid-state image pickup element 1004. Images (image data) obtained by executing signal processing by the signal processing circuit 1006 are supplied to the monitor 1007 and displayed, or supplied to the memory 1008 and stored (recorded).

Also in thus configured image pickup device 1001, FD conversion efficiency can be switched in all the pixels by applying a solid-state image pickup element 1 in place of the above-described solid-state image pickup element 1004.

<Example of Use of Solid-State Image Pickup Element>

Figure 24:
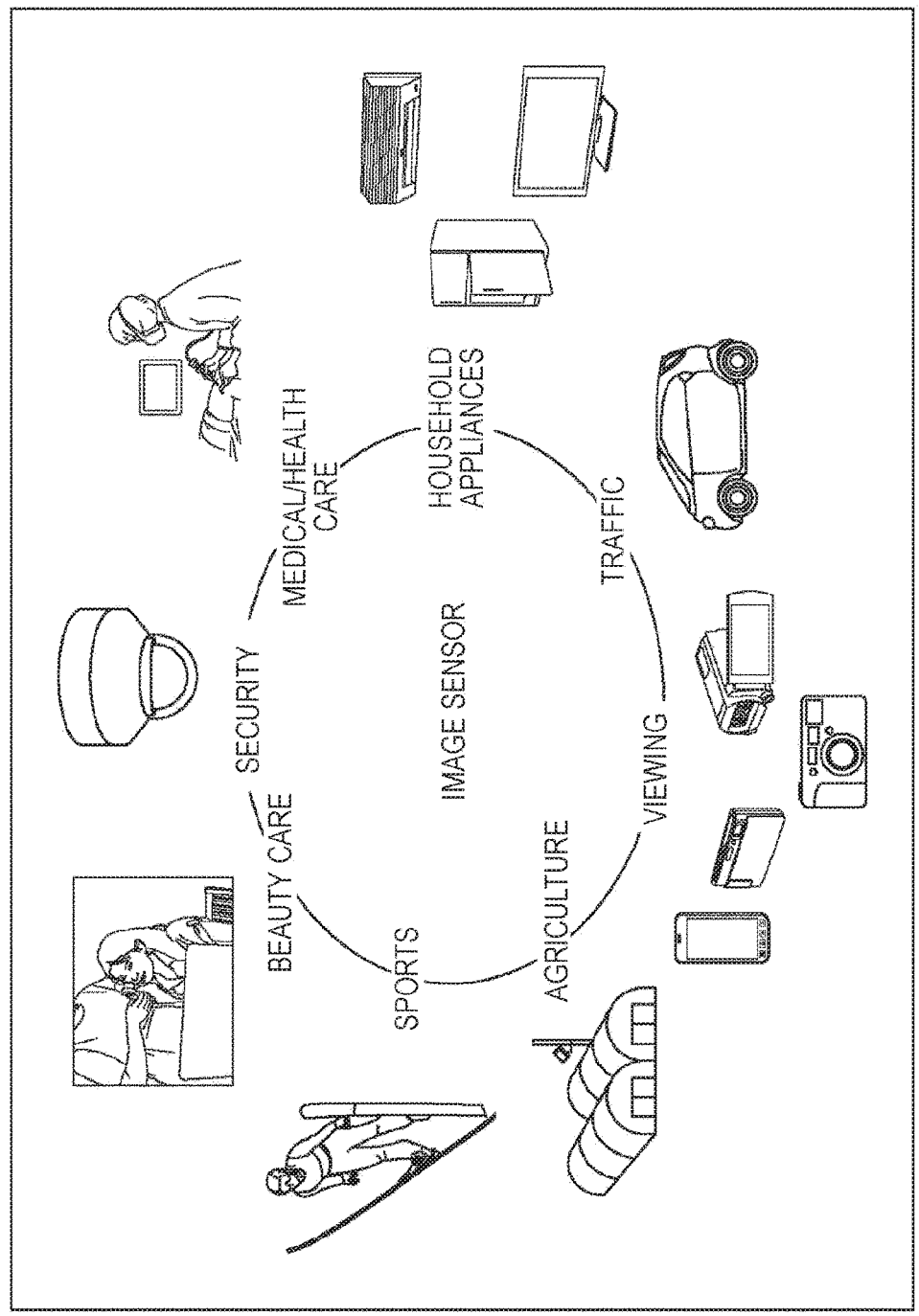
FIG. 24 is a view showing an example of use of a solid-state image pickup element.

FIG. 24 is a view showing an example of use of the above-described solid-state image pickup element 31.

The above-described solid-state image pickup element 31 can be used in various cases, for example, of sensing visible light, infrared light, ultraviolet light, X ray and the like as follows.

Devices for photographing images for viewing, such as a digital camera, a portable apparatus with a camera function, and the like.

Devices for traffic use, such as a vehicle-mounting sensor which photographs the front and rear, surroundings and the inside of a car or the like for the purpose of safety driving such as automatic stop, and for the purpose of recognition of a driver's condition, a monitoring camera which monitors traveling vehicles and roads, a distance sensor which measures a distance between vehicles, and the like.

Devices for use in such household appliances as a TV set, a refrigerator, an air conditioner and the like for the purpose of photographing a user's gesture to conduct apparatus operation according to the gesture.

Devices for medical/health care, such as an endoscope, a device which conducts blood vessel photographing with a received infrared light, and the like.

Devices for security use such as a monitoring camera for crime prevention, a camera for person identification, and the like.

Devices for beauty care such as a skin sensor for photographing a skin, a microscope for photographing a scalp, and the like.

Devices for sport use such as an action camera, a wearable camera and the like for use in sports.

Devices for agricultural use such as a camera for monitoring conditions of fields and farm products, and the like.

Note that the present technology can take the following configurations as well.

(1) A semiconductor device having a plurality of semiconductor chips formed in a semiconductor substrate, wherein at the time of opening a connecting pad, when etching for opening the pad is divisionally conducted a plurality of times on a layer basis, a part of a plurality of layers to be a unit to be etched is subjected to etching for opening a scribe line portion simultaneously with the etching for forming an opening of the pad, thereby removing a part or entire region linking both the portions by etching.

(2) The semiconductor device according to (1), wherein a layer as a part of the layers to be the unit to be etched includes a layer to be etched first in the etching to be divisionally conducted a plurality of times.

(3) The semiconductor device according to (1), wherein a layer as a part of the layers to be the unit to be etched is a plurality of layers including the layer to be etched first in the etching to be divisionally conducted a plurality of times.

(4) The semiconductor device according to (1), wherein a layer as a part of the layers to be the unit to be etched includes a layer with a part thereof or all parts thereof collectively etched with a pattern covering from a blade region of a scribe line portion in which a periphery of the semiconductor device is blade-diced to a region including the pad.

(5) The semiconductor device according to any of (1) to (4), wherein the semiconductor device is a three-dimensional mounting substrate having a lamination of a plurality of semiconductor wafers bonded together, the semiconductor wafers being each provided with a through electrode.

(6) A method for manufacturing a semiconductor device with a plurality of semiconductor chips formed in a semiconductor substrate, including:

a first step of, at the time of opening a connecting pad, when etching for opening the pad is divisionally conducted a plurality of times on a layer basis, subjecting a part of a plurality of layers to be a unit to be etched to etching for forming an opening of ascribe line portion simultaneously with the etching for forming an opening of the pad, as well as conducting etching of a part or entire region linking the opening of the pad and the opening of the scribe line portion; and a second step of conducting etching for forming an opening of only the pad after the first step.

(7) The method for manufacturing a semiconductor device according to (6), further including a third step of conducting, in separate regions, etching for forming an opening of the scribe line portion simultaneously with etching for forming an opening of the pad after the first step and before the second step.

(8) A solid-state image pickup element including:

a light collecting optical portion which collects an incident light;

an optical/electrical conversion portion which converts alight collected by the light collecting optical portion into an electrical signal according to an amount of the light;

a plurality of pixel portions formed with a plurality of the optical/electrical conversion portions;

a wiring layer on one surface side of a semiconductor substrate on which the pixel portions are formed; and a signal processing portion which processes a signal subjected to optical/electrical conversion, wherein with a plurality of semiconductor chips formed in a semiconductor substrate configuring the solid-state image pickup element, at the time of opening a connecting pad, when etching for opening the pad is divisionally conducted a plurality of times on a layer basis, a part of a plurality of layers to be a unit to be etched is subjected to etching for opening a scribe line portion to be blade-diced surrounding the solid-state image pickup device simultaneously with the etching for forming an opening of the pad, thereby removing a part or entire region linking both the portions by etching.

(9) The solid-state image pickup element according to (8), wherein the optical/electrical conversion portion receives a light incident from a surface on which the wiring layer is formed.

(10) The solid-state image pickup element according to (8), wherein the optical/electrical conversion portion receives a light incident from a side opposite to the surface on which the wiring layer is formed.

(11) An image pickup device including a solid-state image pickup element having:

a light collecting optical portion which collects an incident light;

an optical/electrical conversion portion which converts a light collected by the light collecting optical portion into an electrical signal according to an amount of the light;

a plurality of pixel portions formed with a plurality of the optical/electrical conversion portions;

a wiring layer on one surface side of a semiconductor substrate on which the pixel portions are formed; and a signal processing portion which processes a signal subjected to optical/electrical conversion, wherein with a plurality of semiconductor chips formed in a semiconductor substrate configuring the solid-state image pickup element, at the time of opening a connecting pad, when etching for opening the pad is divisionally conducted a plurality of times on a layer basis, a part of a plurality of layers to be a unit to be etched is subjected to etching for opening a scribe line portion to be blade-diced surrounding the solid-state image pickup device simultaneously with the etching for forming an opening of the pad, thereby removing a part or entire region linking both the portions by etching.

(12) An electronic apparatus including a solid-state image pickup element having:

a light collecting optical portion which collects an incident light;

an optical/electrical conversion portion which converts alight collected by the light collecting optical portion into an electrical signal according to an amount of the light;

a plurality of pixel portions formed with a plurality of the optical/electrical conversion portions;

a wiring layer on one surface side of a semiconductor substrate on which the pixel portions are formed; and a signal processing portion which processes a signal subjected to optical/electrical conversion, wherein with a plurality of semiconductor chips formed in a semiconductor substrate configuring the solid-state image pickup element, at the time of opening a connecting pad, when etching for opening the pad is divisionally conducted a plurality of times on a layer basis, a part of a plurality of layers to be a unit to be etched is subjected to etching for opening a scribe line portion to be blade-diced surrounding the solid-state image pickup device simultaneously with the etching for forming an opening of the pad, thereby removing a part or entire region linking both the portions by etching.

REFERENCE SIGNS LIST

11 Lens filter layer
12 Planarizing layer
13 Passivation layer
14 Semiconductor substrate
15 Wiring layer
16 Supporting substrate
31 Solid-state image pickup element
32 Scribe line
41 Blade region
51 Pixel portion
61 Lens material layer
71 Condensing lens layer
72 Color filter layer
81 Optical/electrical conversion portion
82 Active layer
83 Guard ring
91 Wire
92 Insulating film
101 Blade
111 Pad 121 Pad portion
131 Resist layer
201 Wiring layer
251 Wiring layer
271 Through electrode

The invention claimed is:

1. A semiconductor device, comprising:
a semiconductor substrate;
a plurality of semiconductor chips in the semiconductor substrate;
a plurality of layers on the semiconductor substrate;
a pad in a pad portion;
a scribe line portion that comprises a blade region, wherein
a first opening portion in a first part of the plurality of layers connects the blade region and the pad portion, and
a second part of the plurality of layers separates a second opening portion in the blade region from a third opening portion in the pad portion; and
a guard ring in the first opening portion of the first part of the plurality of layers, wherein a fourth opening portion in the pad portion exposes the pad for connection.

2. The semiconductor device according to claim 1, wherein the second part corresponds to a passivation layer of the plurality of layers.

3. The semiconductor device according to claim 1, wherein
the semiconductor device is a three-dimensional mounting substrate having a lamination of a plurality of semiconductor wafers bonded together, and
each semiconductor wafer of the plurality of the semiconductor wafers comprises a through electrode.

4. A method for manufacturing a semiconductor device, comprising:
forming a plurality of semiconductor chips in a semiconductor substrate, wherein
a plurality of layers is on the semiconductor substrate, and
the plurality of layers comprises a lens material layer and a passivation layer;
subjecting the lens material layer of the plurality of layers to a first etching operation for forming a first opening portion in the lens material layer, wherein the first opening portion connects a blade region of a scribe line portion of the semiconductor device and a pad portion of the semiconductor device;
subjecting the passivation layer to a second etching operation for simultaneously forming a second opening portion in the pad portion and a third opening portion in the blade region, wherein the second etching operation is subsequent to the first etching operation; and
subjecting the pad portion to a third etching operation for forming a fourth opening portion in the pad portion, wherein the fourth opening portion exposes a pad in the pad portion for connection, and the third etching operation is subsequent to the second etching operation.

5. A solid-state image pickup element, comprising:
a light collecting optical portion configured to receive an incident light;
a plurality of pixel portions that comprises a plurality of optical/electrical conversion portions, wherein the plurality of optical/electrical conversion portions is configured to convert the incident light received by the light collecting optical portion into an electrical signal, based on an amount of the incident light;
a semiconductor substrate;
a wiring layer on a first surface side of the semiconductor substrate, wherein the plurality of pixel portions is on a second surface side of the semiconductor substrate;
a signal processing portion configured to process a signal subjected to optical/electrical conversion;
a plurality of semiconductor chips in the semiconductor substrate;
a plurality of layers on the semiconductor substrate;
a pad in a pad portion;
a scribe line portion that comprises a blade region, wherein
a first opening portion in a first part of the plurality of layers connects the blade region and the pad portion, and
a second part of the plurality of layers separates a second opening portion in the blade region from a third opening portion in the pad portion; and
a guard ring in the first opening portion of the first part of the plurality of layers, wherein a fourth opening portion in the pad portion exposes the pad for connection.

6. The solid-state image pickup element according to claim 5, wherein
the plurality of optical/electrical conversion portions is further configured to receive the incident light from the second surface side of the semiconductor substrate, and
the second surface side of the semiconductor substrate is opposite to a surface of the wiring layer.

7. An image pickup device, comprising:
a solid-state image pickup element that comprises:
a light collecting optical portion configured to receive an incident light;
a plurality of pixel portions that comprises a plurality of optical/electrical conversion portions, wherein the plurality of optical/electrical conversion portions is configured to convert the incident light received by the light collecting optical portion into an electrical signal based on an amount of the incident light;
a semiconductor substrate;
a wiring layer on a first surface side of the semiconductor substrate, wherein the plurality of pixel portions is on a second surface side of the semiconductor substrate;
a signal processing portion configured to process a signal subjected to optical/electrical conversion;
a plurality of semiconductor chips in the semiconductor substrate;
a plurality of layers on the semiconductor substrate;
a pad in a pad portion;
a scribe line portion that comprises a blade region, wherein
a first opening portion in a first part of the plurality of layers connects the blade region and the pad portion, and
a second part of the plurality of layers separates a second opening portion in the blade region from a third opening portion in the pad portion; and
a guard ring in the first opening portion of the first part of the plurality of layers, wherein a fourth opening portion in the pad portion exposes the pad for connection.

8. An electronic apparatus, comprising:
a solid-state image pickup element that comprises:
a light collecting optical portion configured to receive an incident light;
a plurality of pixel portions that comprises a plurality of optical/electrical conversion portions, wherein the plurality of optical/electrical conversion portions is configured to convert the incident light received by the light collecting optical portion into an electrical signal based on an amount of the incident light;

a semiconductor substrate;

a wiring layer on a first surface side of the semiconductor substrate, wherein the plurality of pixel portions is on a second surface side of the semiconductor substrate;

a signal processing portion configured to process a signal subjected to optical/electrical conversion;

a plurality of semiconductor chips in the semiconductor substrate;

a plurality of layers on the semiconductor substrate;

a pad in a pad portion;

a scribe line portion that comprises a blade region, wherein
- a first opening portion in a first part of the plurality of layers connects the blade region and the pad portion, and
- a second part of the plurality of layers separates a second opening portion in the blade region from a third opening portion in the pad portion; and a guard ring in the first opening portion of the first part of the plurality of layers, wherein a fourth opening portion in the pad portion exposes the pad for connection.

* * * * *